(12) United States Patent
Takechi

(10) Patent No.: US 10,355,028 B2
(45) Date of Patent: Jul. 16, 2019

(54) SEMICONDUCTOR DEVICE, DISPLAY APPARATUS, METHOD OF MANUFACTURING SEMICONDUCTOR DEVICE AND METHOD OF MANUFACTURING DISPLAY APPARATUS

(71) Applicant: Tianma Japan, Ltd., Kanagawa (JP)

(72) Inventor: Kazushige Takechi, Kanagawa (JP)

(73) Assignee: TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 15/704,032

(22) Filed: Sep. 14, 2017

(65) Prior Publication Data

US 2018/0076240 A1     Mar. 15, 2018

(30) Foreign Application Priority Data

Sep. 14, 2016 (JP) ................................. 2016-179541
Jun. 29, 2017 (JP) ................................. 2017-127872

(51) Int. Cl.
    *H01L 27/12*      (2006.01)
    *H01L 27/32*      (2006.01)

(52) U.S. Cl.
    CPC ........ *H01L 27/1251* (2013.01); *H01L 27/124* (2013.01); *H01L 27/127* (2013.01); *H01L 27/1225* (2013.01); *H01L 27/1237* (2013.01); *H01L 27/3262* (2013.01)

(58) Field of Classification Search
    CPC ............... H01L 27/1225; H01L 27/124; H01L 27/1251; H01L 27/1237; H01L 27/127; H01L 27/3262
    USPC .............................................. 257/59, 72, 382
See application file for complete search history.

(56) References Cited

U.S. PATENT DOCUMENTS

2015/0055051 A1    2/2015   Osawa et al.
2017/0125452 A1*   5/2017   Ide ........................ G02F 1/1368

* cited by examiner

*Primary Examiner* — Jasmine J Clark
(74) *Attorney, Agent, or Firm* — Young & Thompson

(57) ABSTRACT

A semiconductor device includes an insulating substrate, a polysilicon layer on the substrate, a first-gate-insulating layer on the polysilicon layer, a first metal layer and an oxide-semiconductor layer both on the first-gate-insulating layer, a second-gate-insulating layer on the oxide-semiconductor layer, a second metal layer on the second-gate-insulating layer, a first top gate planar thin film transistor in which the polysilicon layer forms a channel with a source, drain and gate, and a second top gate thin film transistor in which the oxide-semiconductor layer forms a channel with a source, drain and gate. The source and drain of the first top gate planar thin film transistor and the gate of the second top gate thin film transistor are in the second metal layer. The source or the drain of the first top gate planar thin film transistor and the gate of the second top gate thin film transistor are electrically interconnected.

23 Claims, 38 Drawing Sheets

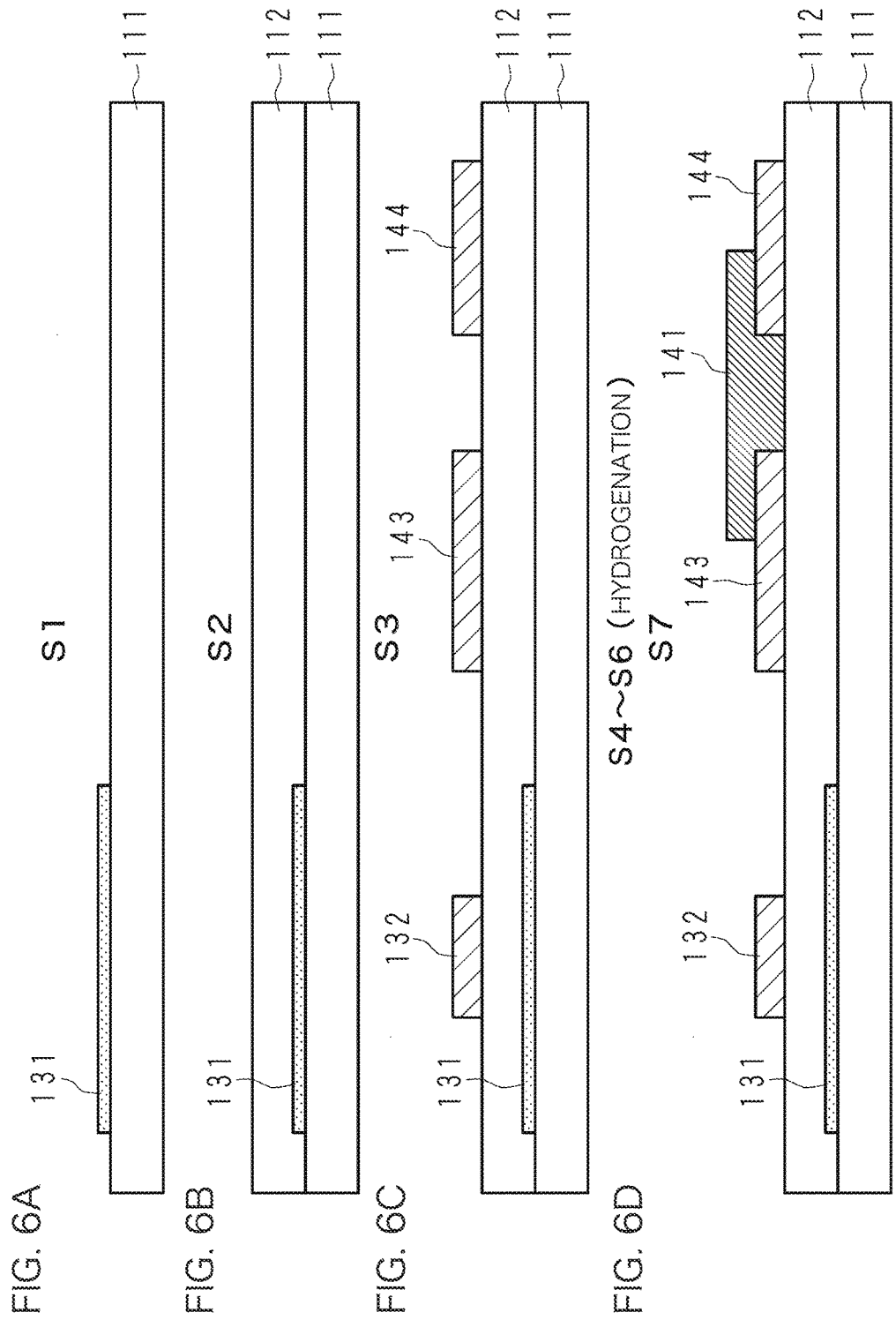

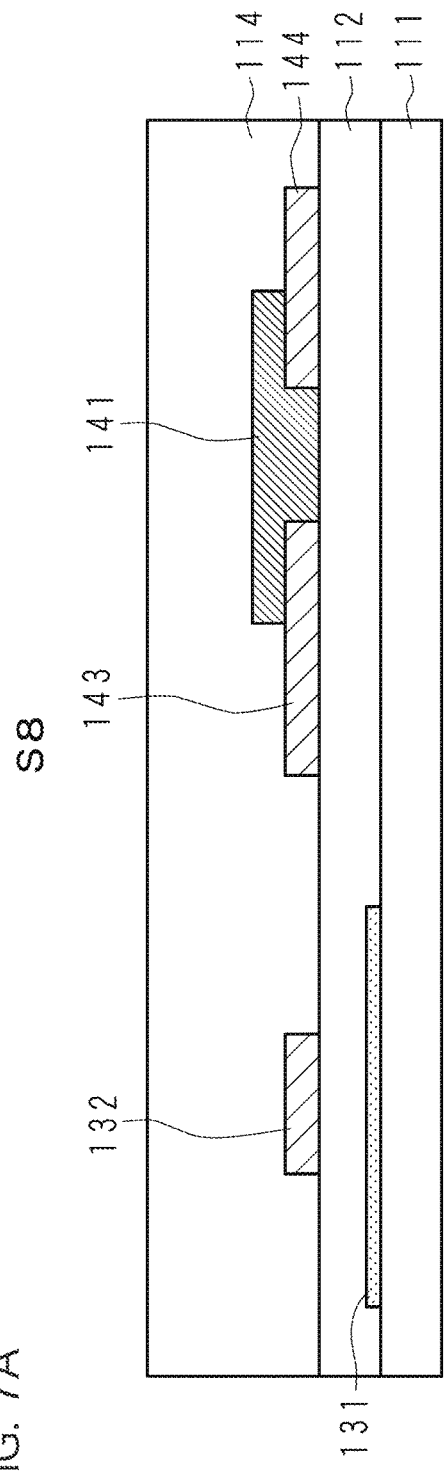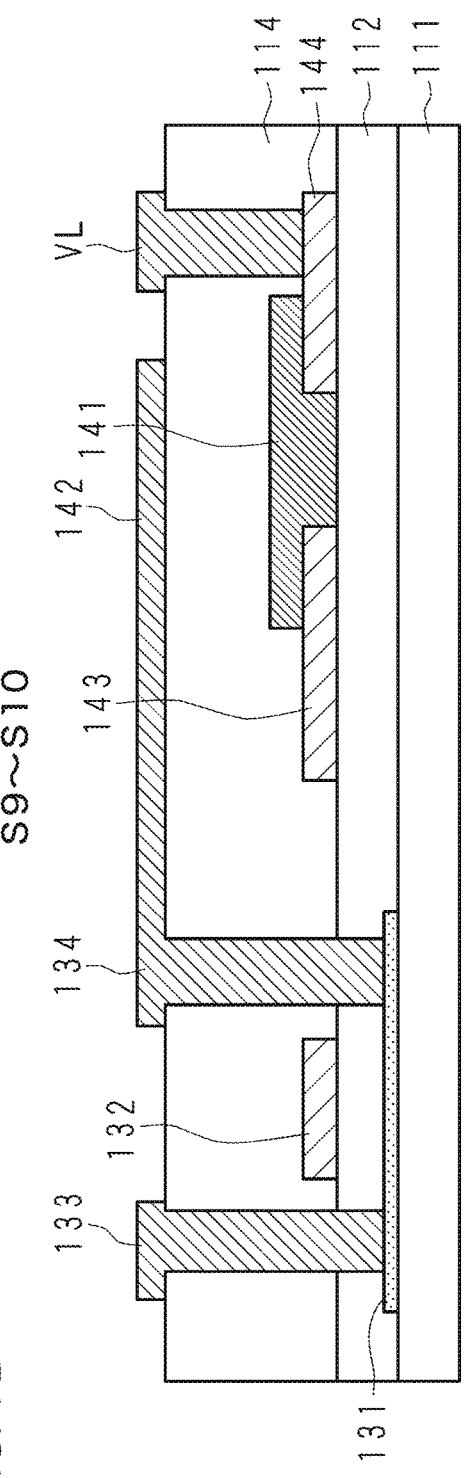

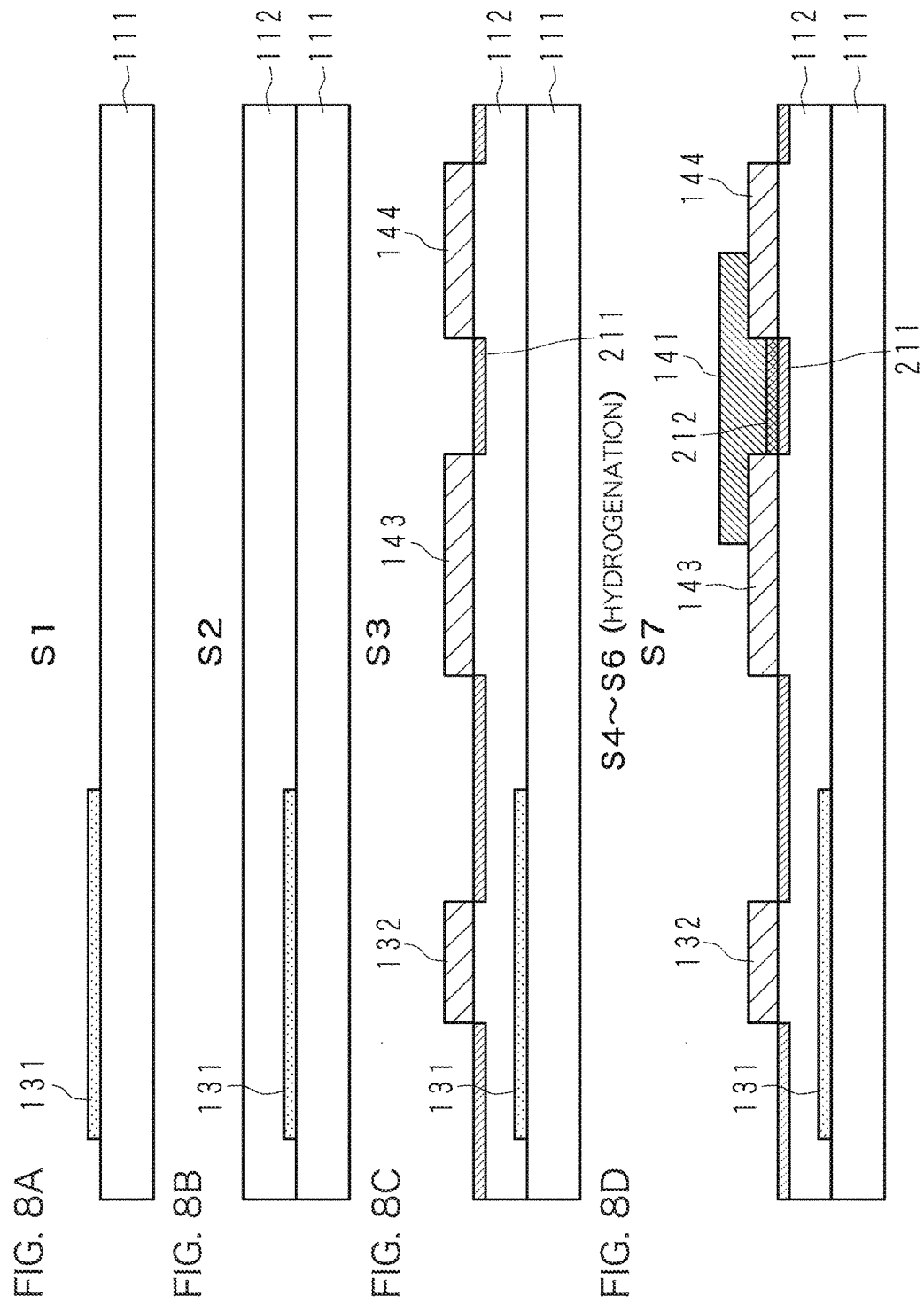

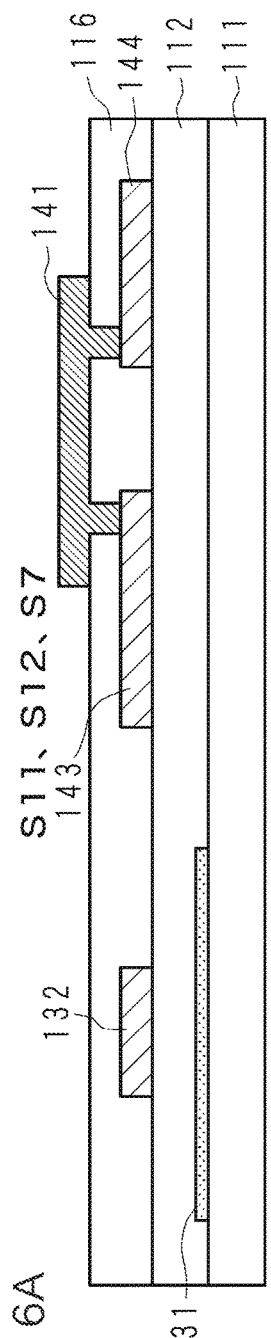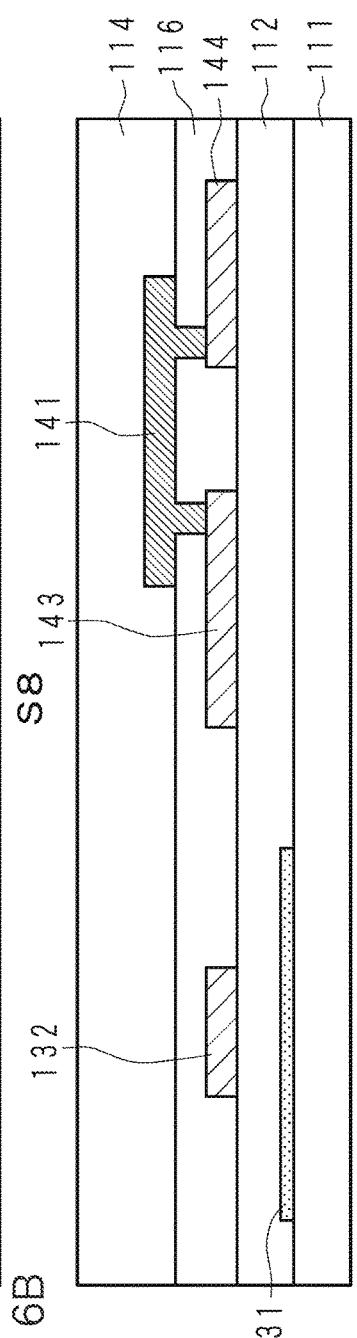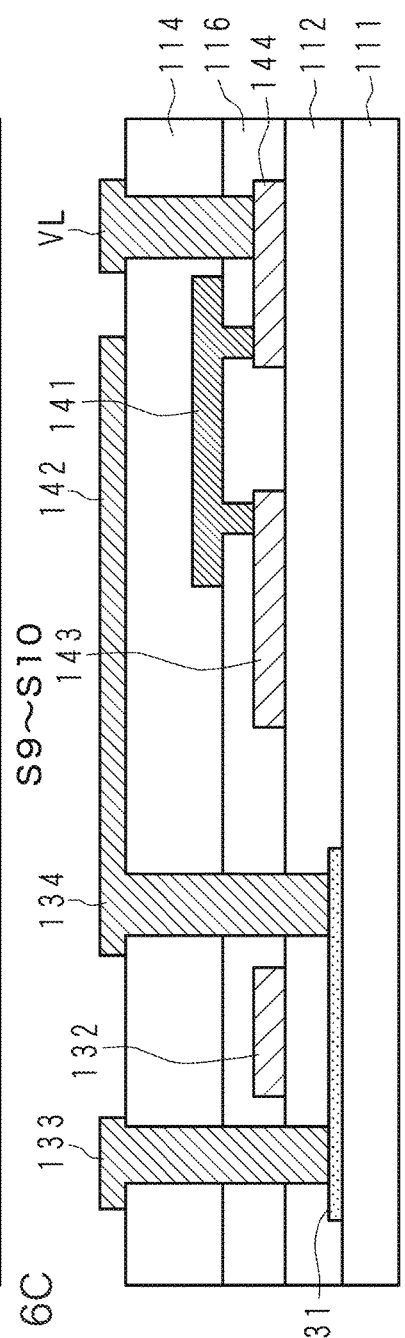

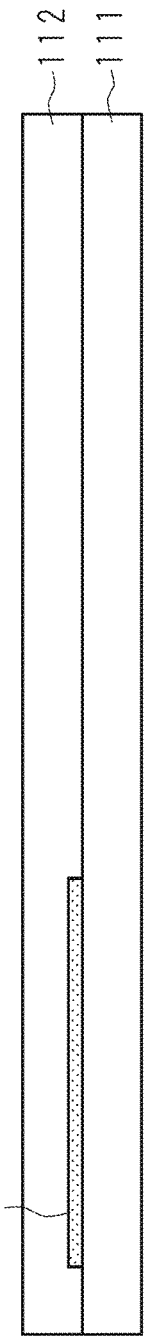
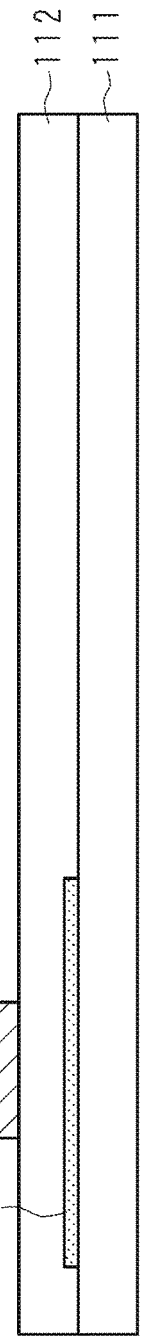
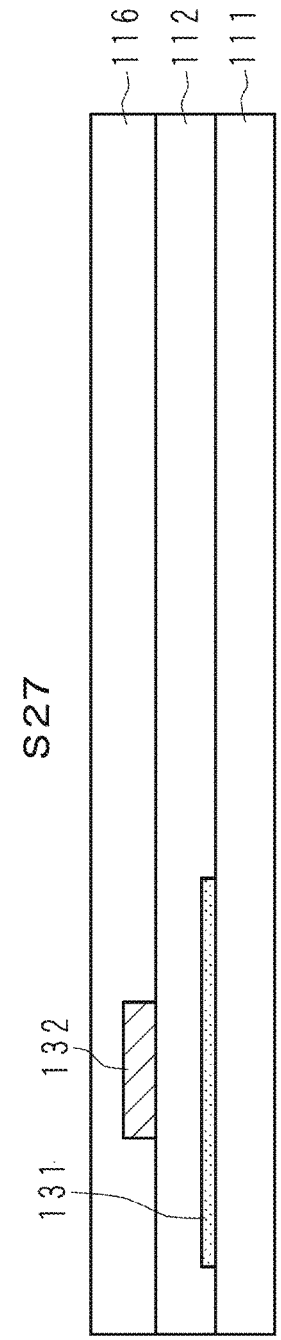

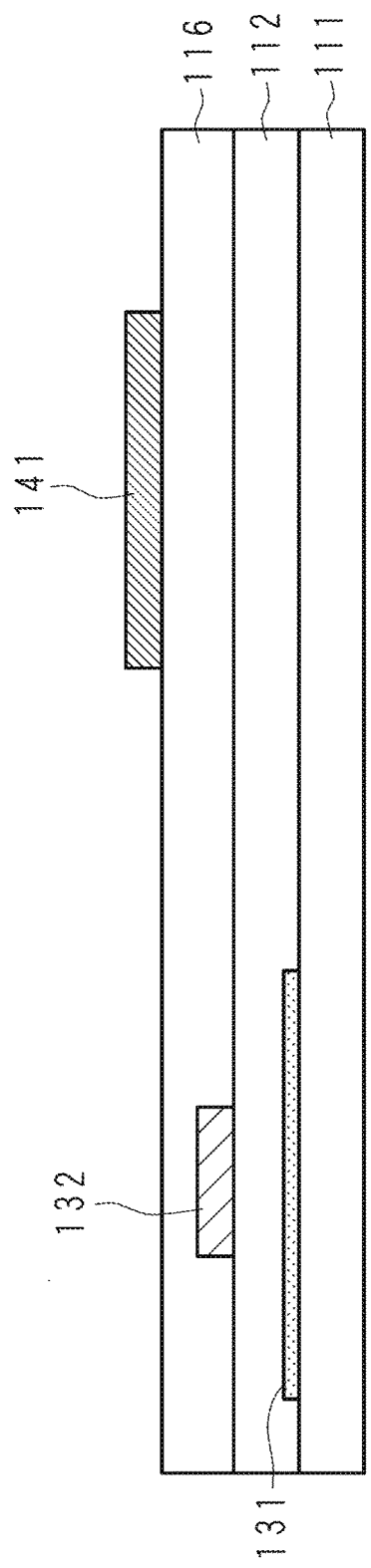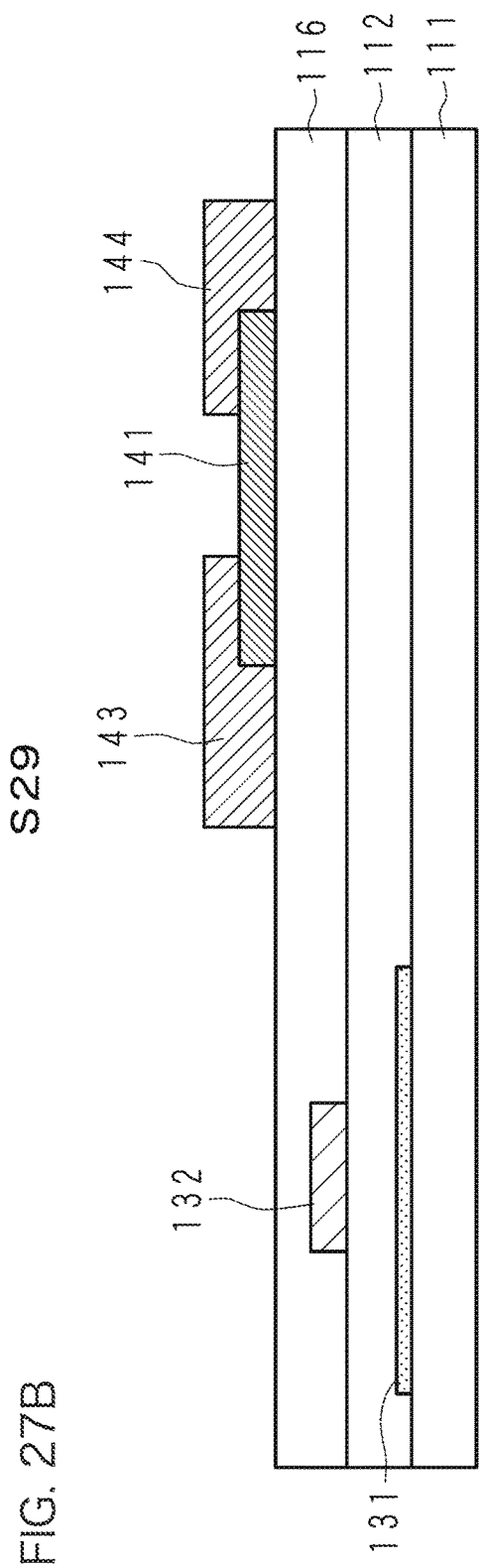

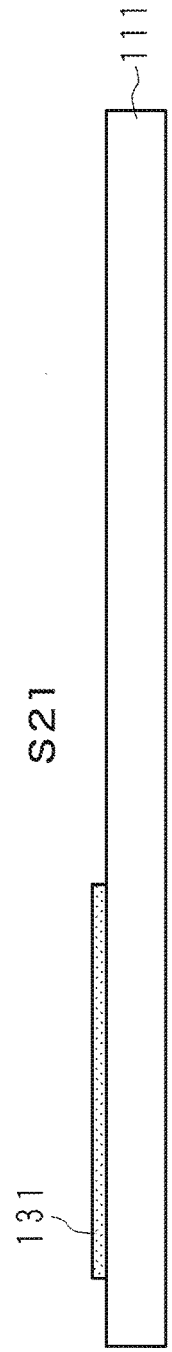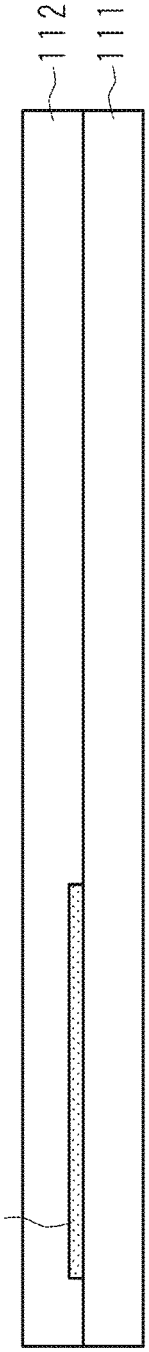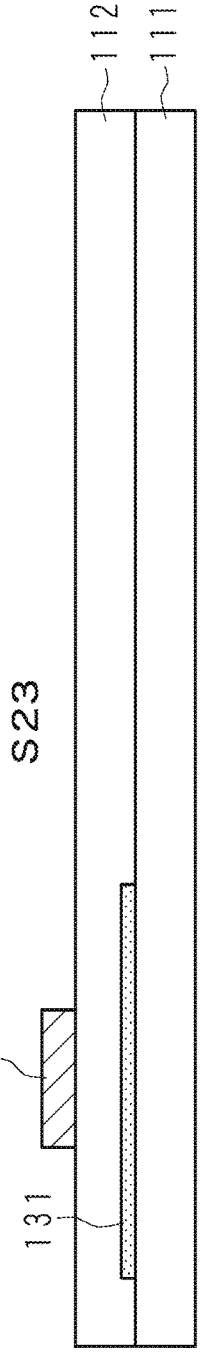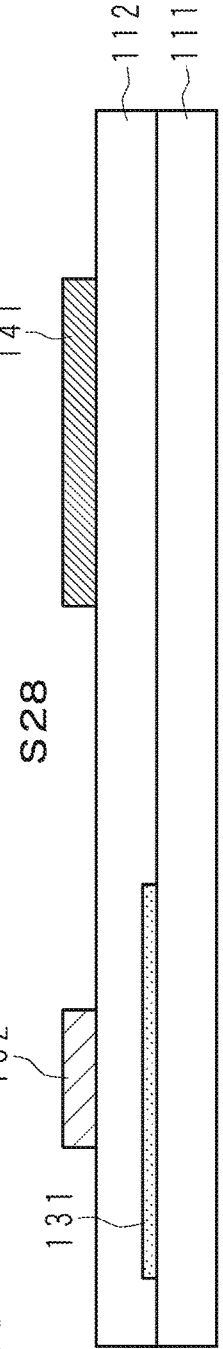

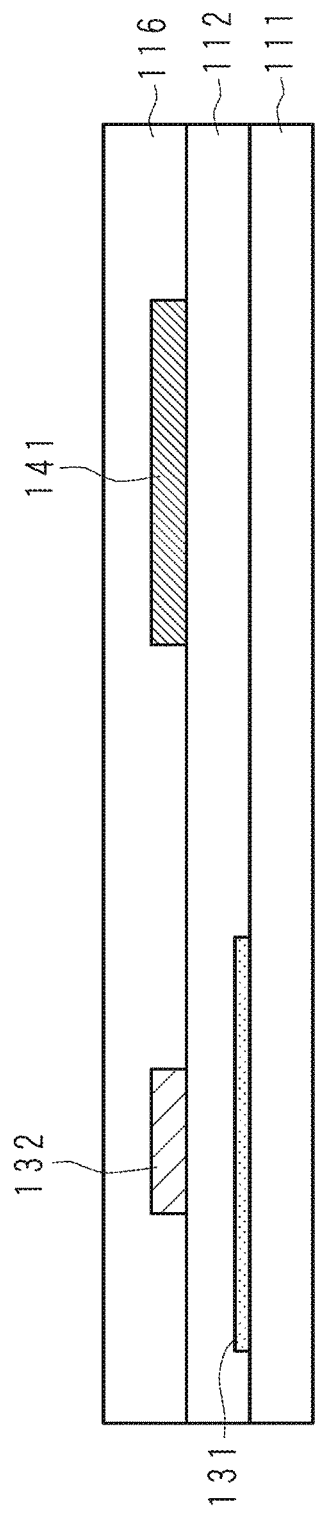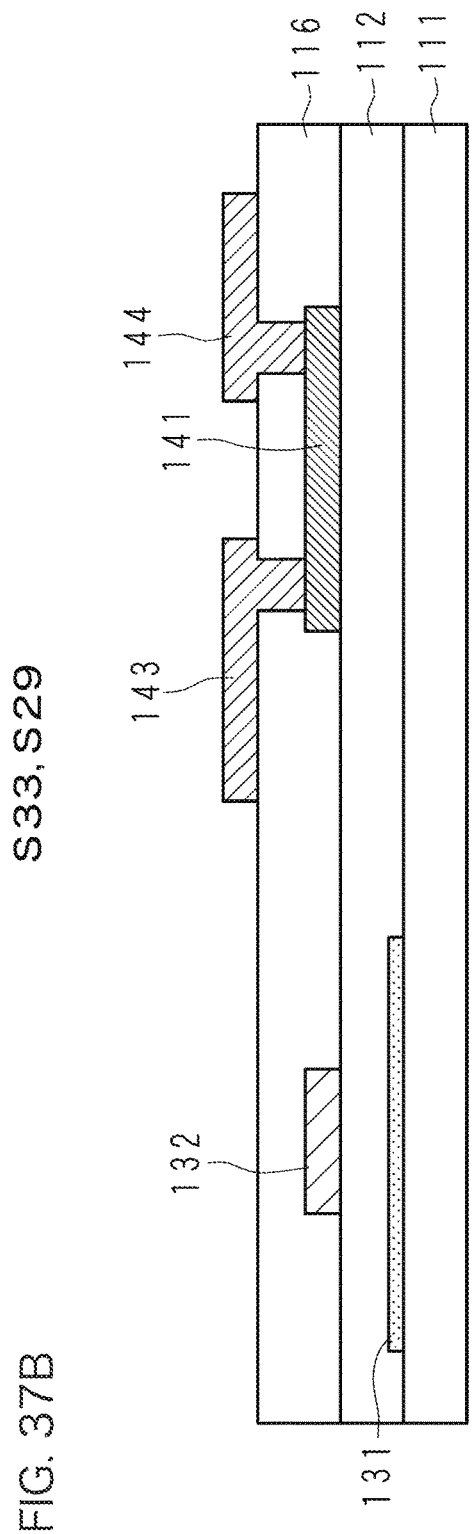

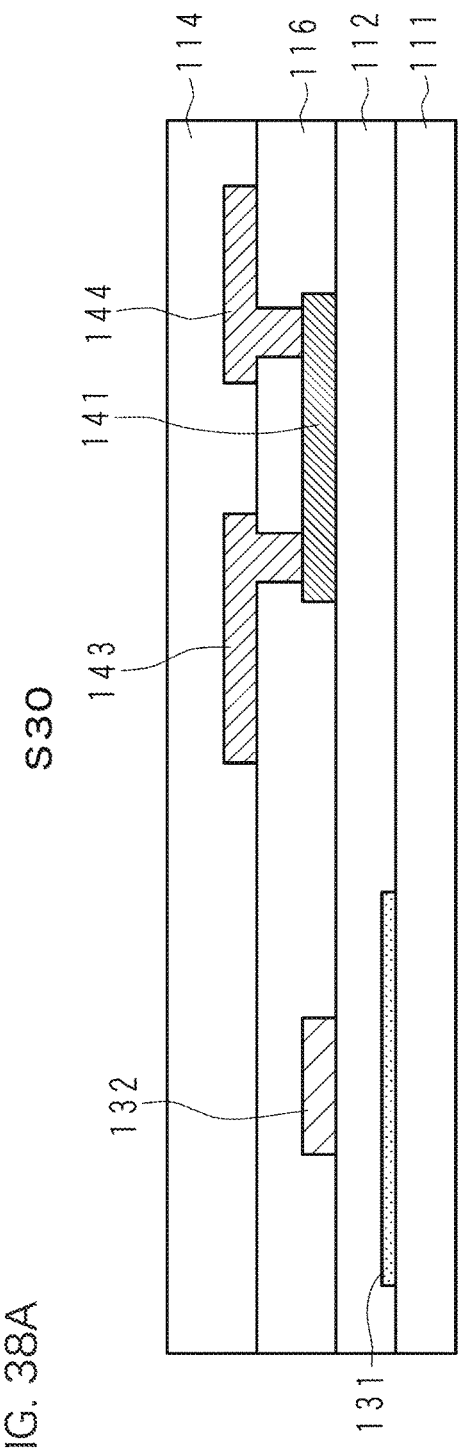
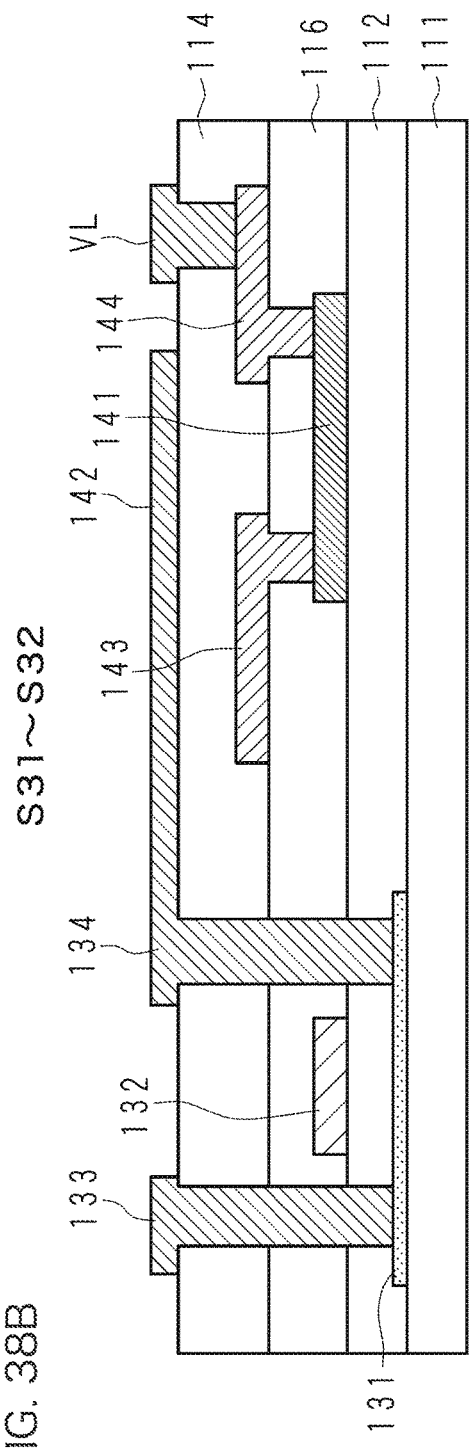
FIG. 38A
FIG. 38B

SEMICONDUCTOR DEVICE, DISPLAY APPARATUS, METHOD OF MANUFACTURING SEMICONDUCTOR DEVICE AND METHOD OF MANUFACTURING DISPLAY APPARATUS

CROSS-REFERENCE TO RELATED APPLICATIONS

This Nonprovisional application claims priority under 35 U.S.C. § 119(a) on Patent Application No. 2016-179541 filed in Japan on Sep. 14, 2016 and Patent Application No. 2017-127872 filed in Japan on Jun. 29, 2017, the entire contents of which are hereby incorporated by reference.

FIELD

The present application relates to a semiconductor device, a display apparatus, a method of manufacturing the semiconductor device and a method of manufacturing the display apparatus.

BACKGROUND

In a display apparatus such as an organic electro luminescence display apparatus, a liquid crystal display apparatus or the like, a thin film transistor (TFT) is used in a pixel circuit. Examples of thin-film transistors include an a-Si thin film transistor using amorphous silicon (a-Si) for a semiconductor, a low temperature polysilicon (LTPS) thin film transistor obtained by crystallizing a-Si by laser annealing, and an oxide thin film transistor using an oxide semiconductor film.

The a-Si thin film transistor is a thin film transistor containing a-Si in an active layer. The LTPS thin film transistor is a thin film transistor containing LTPS in an active layer. The oxide thin film transistor is a thin film transistor containing an oxide semiconductor in an active layer.

Here, comparing between the characteristics of the LTPS thin film transistor and the oxide thin film transistor, the following differences are observed. The LTPS thin film transistor requires a long channel length, which increases the occupied area. In comparison, the oxide thin film transistor may have a short channel length, which makes the occupied area small. The LTPS thin film transistor generates hysteresis in the source-drain current for the gate voltage. In comparison, the oxide thin film transistor generates minor hysteresis. The LTPS thin film transistor has a high switching performance. In comparison, the oxide thin film transistor has a low switching performance.

In recent years, a semiconductor device has been proposed in which both the LTPS thin film transistor and the oxide thin film transistor are mounted thereto while taking advantage of the characteristics of the two thin film transistors. For example, United States Unexamined Patent Application Publication No. 2015/0055051 proposes a semiconductor device in which an LTPS thin film transistor and an oxide thin film transistor are mounted in a pixel circuit, and a display apparatus comprising the semiconductor device.

However, in the related art such as United States Unexamined Patent Application Publication No. 2015/0055051, a gate insulating layer is formed of one same layer for the oxide thin film transistor and the LTPS thin film transistor. This causes the following problems.

In the manufacturing steps of the LTPS thin film transistor, typically, an activation step and a hydrogenation step are performed after the gate is formed. In the hydrogenation step, an oxide-semiconductor layer of an oxide thin film transistor is exposed to a hydrogen atmosphere. This results in a lowered resistance value for the oxide-semiconductor layer. Accordingly, the formed oxide thin film transistor indicates a normally-on characteristic. Normally-on means that the drain current flows and it keeps turn on state of the transistor when there is no voltage applied to the gate of the transistor. In the case where the oxide thin film transistor is used for a purpose where normally-on is not preferable, a device indicating the normally-on characteristic would be a defective product. This may lead to reducing in yield of semiconductor devices.

SUMMARY

According to one aspect, a semiconductor device includes an insulating substrate, a polysilicon layer formed on the insulating substrate, a first-gate-insulating layer formed on the polysilicon layer, a first metal layer formed on the first-gate-insulating layer, an oxide-semiconductor layer formed on the first-gate-insulating layer, a second-gate-insulating layer formed on the oxide-semiconductor layer, a second metal layer formed on the second-gate-insulating layer, a first top gate planar thin film transistor in which the polysilicon layer serves as a channel and which includes a source, a drain and a gate, and a second top gate thin film transistor in which the oxide-semiconductor layer serves as a channel and which includes a source, a drain and a gate, wherein the source and the drain of the first top gate planar thin film transistor and the gate of the second top gate thin film transistor are made of the second metal layer, and the source or the drain of the first top gate planar thin film transistor and the gate of the second top gate thin film transistor are electrically connected to each other.

It is to be understood that both the foregoing general description and the following detailed description are exemplary and explanatory and are not restrictive of this disclosure.

BRIEF DESCRIPTION OF THE DRAWINGS

FIGS. 6A-6D are cross-sectional views illustrating a manufacturing procedure for the semiconductor device according to Embodiment 1;

FIGS. 7A and 7B are cross-sectional views illustrating a manufacturing procedure for the semiconductor device according to Embodiment 1;

FIGS. 8A-8D are cross-sectional views illustrating a manufacturing procedure for a semiconductor device according to Embodiment 2;

FIGS. 16A-16C are cross-sectional views illustrating a manufacturing procedure for the semiconductor device;

FIGS. 26A-26D are cross-sectional views illustrating a manufacturing procedure for the semiconductor device according to Embodiment 8;

FIGS. 27A and 27B are cross-sectional views illustrating a manufacturing procedure for the semiconductor device according to Embodiment 8;

FIGS. 36A-36D are cross-sectional views illustrating a manufacturing procedure for the semiconductor device according to Embodiment 11;

FIGS. 37A and 37B are cross-sectional views illustrating a manufacturing procedure for the semiconductor device according to Embodiment 11; and FIGS. 38A and 38B are cross-sectional views illustrating a manufacturing procedure for the semiconductor device according to Embodiment 11.

DESCRIPTION OF EMBODIMENTS

Figure 1:
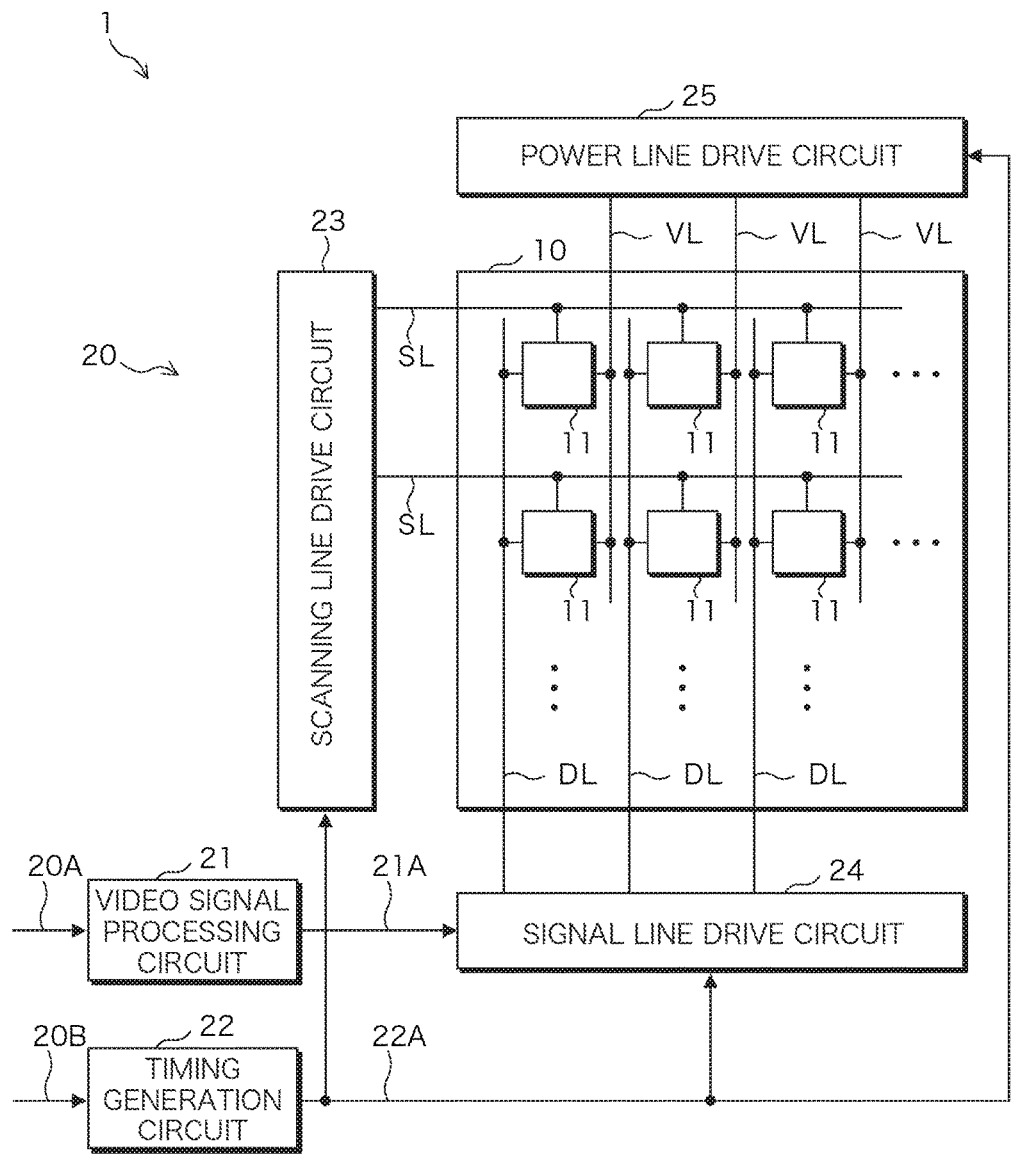
FIG. 1 is a block diagram illustrating a schematic configuration of an organic EL display apparatus.

Embodiments will be described below in detail with reference to the drawings. It is noted that the ordinal numbers such as "first" and "second" in the specification and claims are denoted for the purpose of clarifying the relationship between elements and preventing the mix-up of elements. These ordinal numbers are therefore not to limit the number of elements.

Moreover, the term "connect" means that connected elements are electrically connected with each other. The expression "electrically connect" also includes the cases where elements are connected through an electrical element such as an electrode, a wiring, a resistance or a capacitor.

The expression "on an insulating layer" means to explicitly indicate the direction in which layers are formed, and does not necessarily mean that an element is adjacent to the insulating layer. For example, the expression "forming an oxide-semiconductor layer on a first-gate-insulating layer" includes the case where the first-gate-insulating layer and the oxide-semiconductor layer are adjacent to each other, and also the case where the first-gate-insulating layer and the oxide-semiconductor layer are disposed while another layer is interposed between them. Moreover, "upper" indicates the upper direction in the drawings.

The size and scale of each component in the drawings are appropriately modified so as to ensure the visibility of the drawings. Moreover, hatched parts in the drawings are intended to distinguish components from each other, not necessarily indicating cut planes.

The cross-sectional view illustrating a layered state is for illustrating the order of layering, while the thickness and size of each layer as well as the relationship of the thicknesses between layers (dimensional relationship) are not limited to the ones illustrated.

Hereinafter, as an application example of the semiconductor device, a pixel drive circuit in an organic EL display apparatus is described. FIG. 1 is a block diagram illustrating a schematic configuration of an organic EL display apparatus 1. The organic EL display apparatus 1 includes a display panel 10 and a drive circuit 20.

An image is displayed on the display panel 10. The display panel 10 is driven by active-matrix. The display panel 10 has a pixel array unit. Multiple pixels 11 are included in the pixel array unit. The pixels 11 are arranged in matrix. Each of the pixels 11 corresponds to any one of the pixels of red (R), green (G), blue (B) and white (W), for example. Each pixel 11 includes an organic EL element.

The pixel array unit includes power lines VL as well as multiple scanning lines SL and signal lines DL. The multiple scanning lines SL are provided along the row direction of the pixel array unit, for example. The multiple signal lines DL are provided along the column direction of the pixel array unit, for example. The power line VL is provided along each of the signal lines DL. One end of each of the scanning lines SL, signal lines DL and power lines VL is connected to the drive circuit 20. Each of the pixels 11 is so disposed as to correspond to a crossing portion of each of the scanning lines SL and each of the signal lines DL.

The drive circuit 20 drives the pixel array unit for display. The drive circuit 20 includes a video signal processing circuit 21, a timing generation circuit 22, a scanning line drive circuit 23, a signal line drive circuit 24 and a power line drive circuit 25.

The video signal processing circuit 21 performs gamma correction or overdrive correction for a digital video signal 20A input from the outside. The video signal processing circuit 21 outputs a corrected video signal to the signal line drive circuit 24.

The timing generation circuit 22 generates a control signal 22A based on a synchronization signal 20B input from the outside and outputs the generated control signal 22A. The control signal 22A serves to control the scanning line drive circuit 23, the signal line drive circuit 24 and the power line drive circuit 25 such that these circuits operate in coordination with one another.

The scanning line drive circuit 23 sequentially applies scanning line voltage to the multiple scanning lines SL in accordance with the control signal 22A. Application of the scanning line voltage allows the pixels 11 to be selected in sequence.

The signal line drive circuit 24 generates an analog video signal corresponding to a video signal input from the video signal processing circuit 21 in accordance with the control signal 22A. The generated analog video signal is applied to each signal line DL.

The power line drive circuit 25 sequentially applies power voltage to the multiple power lines VL in accordance with the control signal 22A. The power voltage controls light emission and light extinction of each organic EL element.

The drive circuit 20 controls each of the pixels 11 as follows. The pixel 11 is selected in accordance with the control signal 22A output from the scanning line drive circuit 23. To the selected pixel, a video signal voltage based on the analog video signal output from the signal line drive circuit 24 is written. It is noted that writing of a video signal means that a predetermined voltage is applied between the gate and source of a driving transistor, which will be described later.

Figure 2:
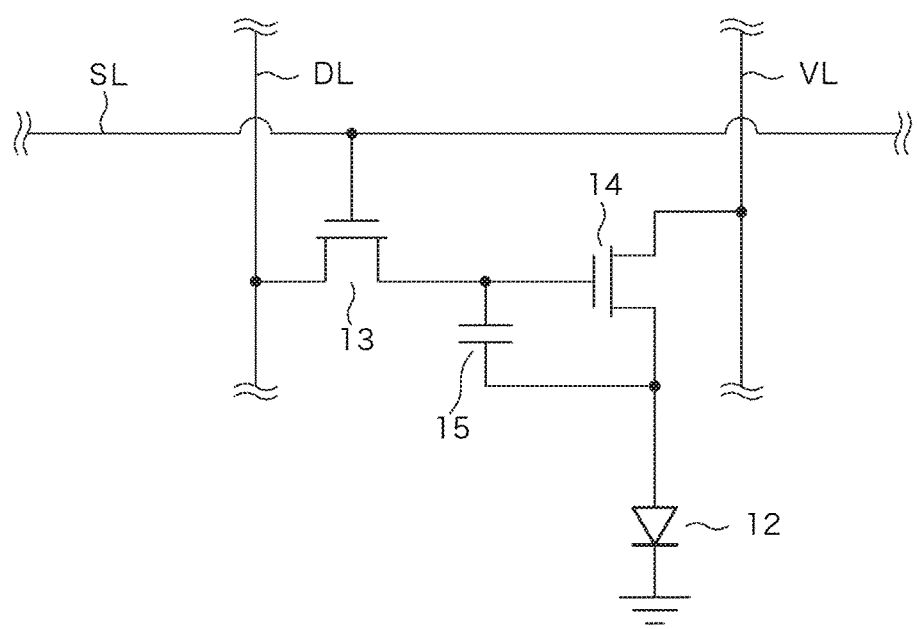
FIG. 2 is a circuit diagram illustrating an example of a pixel drive circuit provided for each pixel.

FIG. 2 is a circuit diagram illustrating an example of a pixel drive circuit provided for each pixel. The pixel drive circuit includes an organic EL element 12 which is a light emitting element, a first transistor 13, a second transistor 14 and a storage capacitor 15. An anode of the organic EL element 12 is connected to the source of the second transistor 14 and one end of the storage capacitor 15. The cathode of the organic EL element 12 is connected to the power supply ground. The other end of the storage capacitor 15 is connected to the drain of the first transistor 13. The other end of the storage capacitor 15 is also connected to the gate of the second transistor 14. The drain of the second transistor 14 is connected to the power line VL. The source of the first transistor 13 is connected to the signal line DL. The gate of the first transistor 13 is connected to the scanning line SL.

The first transistor 13 is a switch thin film transistor for selecting the pixel. The second transistor 14 is a driving thin film transistor for causing current to flow, which is necessary for the organic EL element 12 to emit light. As for the writing, when the gate of the first transistor 13 connected to the scanning line SL is turned on, the signal line DL is captured into the pixel while a voltage is written into the storage capacitor 15. Even when the gate of the first transistor 13 is turned off, the voltage written into the storage capacitor controls the second transistor 14, causing a set value of current to flow in the organic EL element 12. This maintains the operation state of the organic EL element 12 until the next writing is performed.

As described above, in the pixel drive circuit, the first transistor 13 preferably has a high switching performance.

Moreover, the second transistor 14 preferably has a small hysteresis for the characteristic of the source-drain current with respect to the gate voltage. In the following embodiments, therefore, the first transistor 13 is assumed as an LTPS thin film transistor whereas the second transistor 14 is assumed as an oxide thin film transistor.

Embodiment 1

Figure 3:
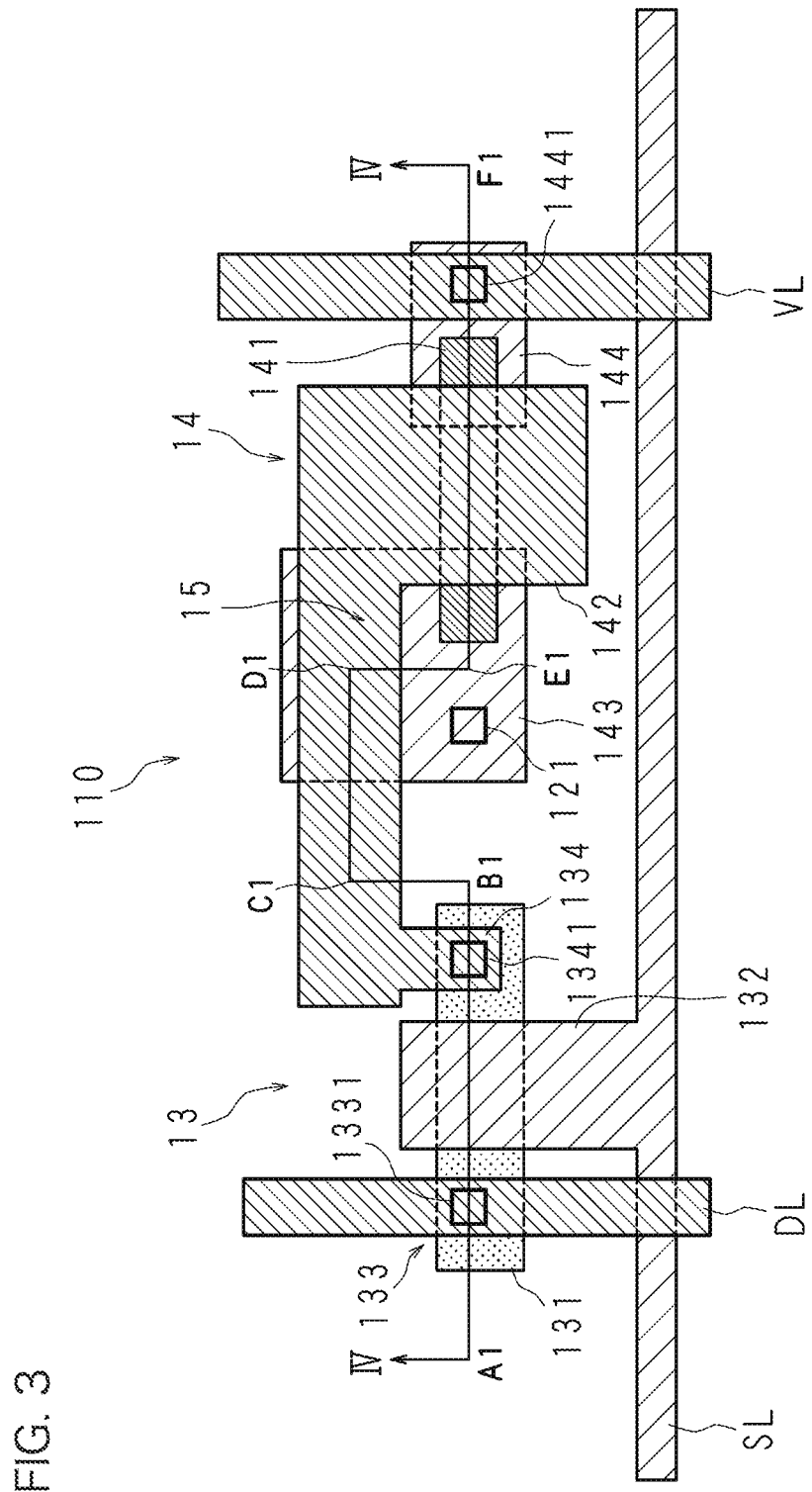
FIG. 3 is a plan view illustrating a configuration example of a semiconductor device included in a pixel drive circuit.
Figure 4:
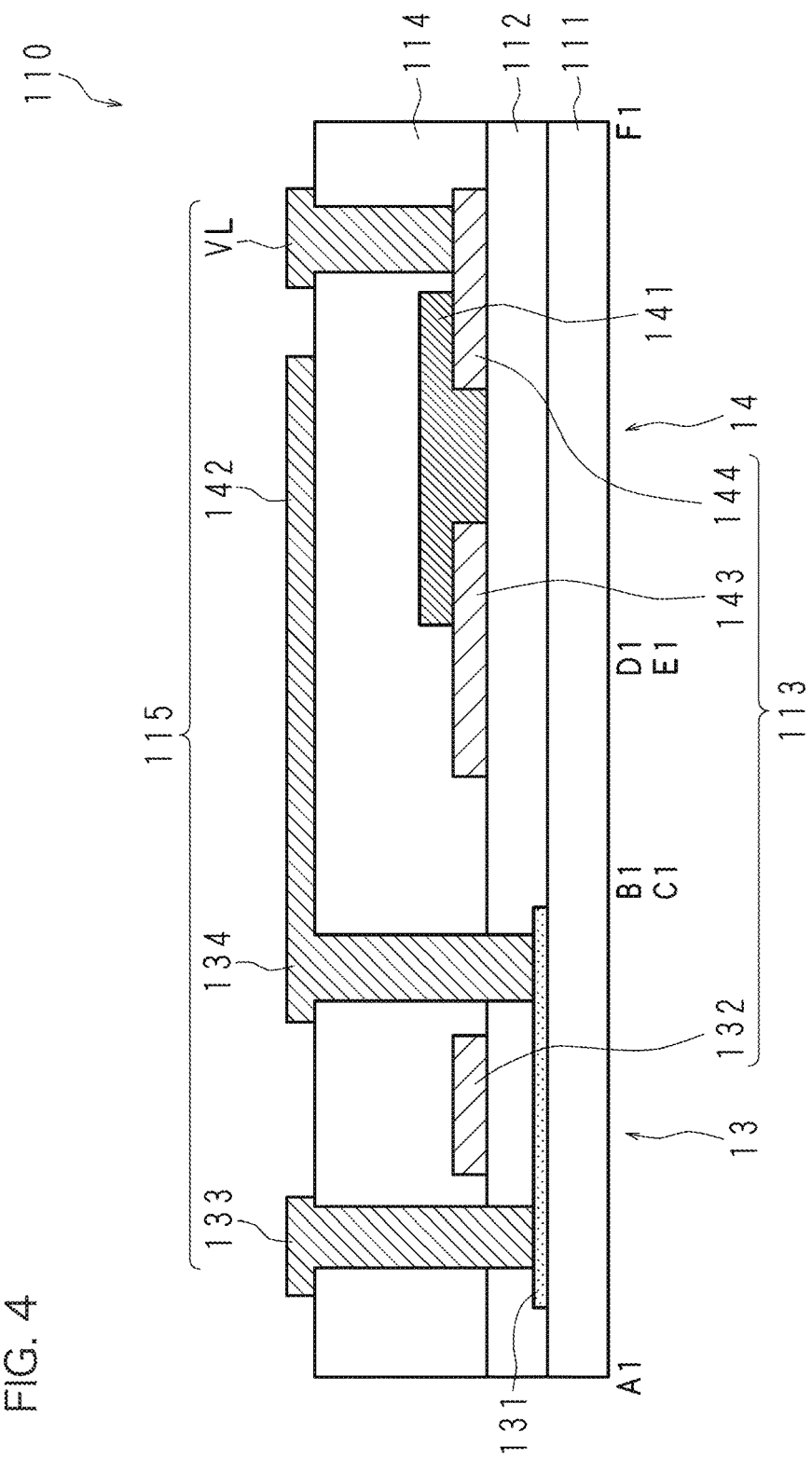
FIG. 4 is a cross-sectional view taken along the section line IV-IV in FIG. 3.

FIG. 3 is a plan view illustrating a configuration example of a semiconductor device 110 included in a pixel drive circuit. FIG. 4 is a cross-sectional view taken along the section line IV-IV in FIG. 3. The semiconductor device 110 includes an insulating substrate 111, a polysilicon layer 131, a first-gate-insulating layer 112, a first metal layer 113, an oxide-semiconductor layer 141, a second-gate-insulating layer 114 and a second metal layer 115.

In the semiconductor device 110, layers are formed on the insulating substrate 111 in the above-described order. That is, the polysilicon layer 131 is formed on the insulating substrate 111. The first-gate-insulating layer 112 is formed on the polysilicon layer 131. The first metal layer 113 is formed on the first-gate-insulating layer 112. The oxide-semiconductor layer 141 is further formed on the first-gate-insulating layer 112. The second-gate-insulating layer 114 is formed on the oxide-semiconductor layer 141. The second metal layer 115 is formed on the second-gate-insulating layer 114.

The insulating substrate 111 is used for the insulative materials. For example, glass is the material having properties of insulation and transparency. The insulating substrate 111 has a plate-like shape. The insulating substrate 111 is, for example, a glass plate. The polysilicon layer 131 is a layer made of polysilicon, e.g., low-temperature polysilicon (LTPS). The first-gate-insulating layer 112 and the second-gate-insulating layer 114 are formed with insulating material. The insulating material may be, for example, silicon oxide or silicon nitride. The first metal layer 113 and the second metal layer 115 are formed with conductive metal. The conductive metal may be, for example, aluminum (Al), tantalum (Ta), molybdenum tantalum (MoTa) or molybdenum tungsten (MoW). The oxide-semiconductor layer 141 is a layer made of an oxide semiconductor. The oxide semiconductor is, for example, InGaZnO.

In the semiconductor device 110, the first transistor 13 and the second transistor 14 are formed. The first transistor 13 and the second transistor 14 are aligned in the wiring direction of the scanning line SL. The first transistor 13 uses the polysilicon layer 131 as a channel. Hereinafter, the polysilicon layer 131 will also be referred to as a channel 131 or a first channel semiconductor layer. The gate 132 is made of the first metal layer 113. That is, a portion of the first metal layer 113 that is opposed to the polysilicon layer 131 serves as the gate 132 of the first transistor 13. The source 133 and the drain 134 of the first transistor 13 is made of the second metal layer 115. That is, the source 133 is a portion of the second metal layer 115. The source 133 is electrically connected to the channel 131 through a contact hole 1331. Likewise, the drain 134 is a portion of the second metal layer 115. The drain 134 is electrically connected to the channel 131 through a contact hole 1341. The first transistor 13 is a top-gate planar thin film transistor.

The second transistor 14 uses the oxide-semiconductor layer 141 as a channel. Hereinafter, the oxide-semiconductor layer 141 will also be referred to as a channel 141 or a second channel semiconductor layer. The gate 142 is made of the second metal layer 115. That is, a portion of the second metal layer 115 that is opposed to the channel 141 serves as the gate 142. The source 143 and the drain 144 of the second transistor 14 are made of the first metal layer 113. The second transistor 14 is a top-gate staggered thin film transistor. In view of the superordinate concept, the second transistor 14 may also be called a top-gate thin film transistor.

The drain 134 of the first transistor 13 and the gate 142 of the second transistor 14 are made of the same second metal layer 115. The drain 134 and the gate 142 are physically integrated with each other. Electrical conduction is made between the drain 134 and the gate 142. One portion of the integrated second metal layer 115 forms a hook-like shape elongated in the direction of the scanning line SL. The portion including the gate 142 is the longest in the direction of the signal line DL. The portion including the drain 134 is the next longest in the direction of the signal line DL.

A portion of the first metal layer 113 serving as the source 143 of the second transistor 14 expands in the wiring direction of the signal line DL. A portion of the second metal layer 115 that connects the drain 134 of the first transistor 13 and the gate 142 of the second transistor 14 is opposed to a portion of the first metal layer 113 across the second-gate-insulating layer 114 which is interposed between them. With the second-gate-insulating layer 114 in between, the opposed portions of the first metal layer 113 and the second metal layer 115 serve as the storage capacitor 15. Moreover, at a part of the source 143 of the second transistor 14, a contact hole 121 is formed. The contact hole 121 is for electrically connecting the anode of the organic EL element 12 and the source 143.

The scanning line SL which controls the gate 132 of the first transistor 13 is a part of the first metal layer 113. The gate 132 and the scanning line SL are physically integrated with each other. Electrical conduction is made between the gate 132 and the scanning line SL. The scanning line SL is also referred to as a scan line.

The signal line DL is made of the second metal layer 115. The signal line DL and the source 133 of the first transistor 13 are physically integrated with each other. Electrical conduction is made between the signal line DL and the source 133. The signal line DL is also referred to as a data line.

The power line VL is made of the second metal layer 115. The power line VL and the drain 144 of the second transistor 14 are connected to each other through the contact hole 1441.

Figure 5:
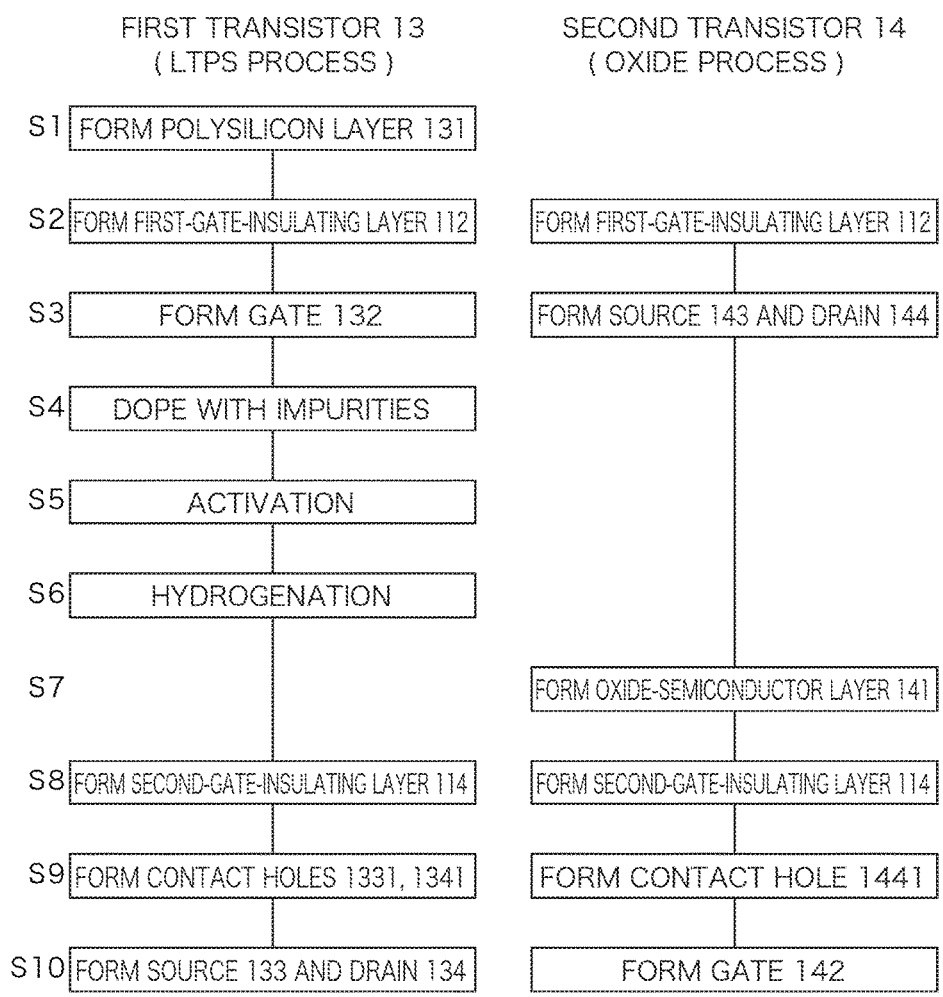
FIG. 5 is a flowchart illustrating a manufacturing procedure for a semiconductor device.

A manufacturing procedure for the semiconductor device 110 will now be described. FIG. 5 is a flowchart illustrating a manufacturing procedure for the semiconductor device 110. FIGS. 6A to 6D and 7A to 7B are cross-sectional views illustrating the manufacturing procedure for the semiconductor device 110. The cross-sections in FIGS. 6A to 6D and 7A to 7B are similar to the cross-section in FIG. 4. An LTPS process for forming the first transistor 13 and an oxide semiconductor process for forming the second transistor 14 are carried out concurrently and in parallel. The steps illustrated side by side in FIG. 5 imply that they are performed at the same time. FIGS. 6A to 6D illustrate the finished state after the each of steps in FIG. 5. The configuration obtained after performing a part of the procedure illustrated in FIG. 5 will not be illustrated in FIGS. 6A to 6D and 7A to 7B.

First, the insulating substrate 111 is prepared. The polysilicon layer 131 is formed on the insulating substrate 111 (step S1). At step S1, a-Si is deposited on the insulating substrate 111 by, for example, a chemical vapor deposition (CVD) method. The a-Si is crystallized by excimer laser annealing (ELA), to form polysilicon (so-called LTPS step). Thereafter, an island step including a photoresist step and an etching step is performed. By performing these steps, the polysilicon layer 131 of an island shape having a predetermined surface area is completed. The state illustrated in FIG. 6A is thus obtained.

The first-gate-insulating layer 112 is formed on the insulating substrate 111 and the polysilicon layer 131 (step S2). The state illustrated in FIG. 6B is thus obtained. The gate 132 of the first transistor 13 as well as the source 143 and drain 144 of the second transistor 14 are formed on the first-gate-insulating layer 112 (step S3). At step S3, the sputtering method or the like is used to deposit the first metal layer 113. The first metal layer 113 is composed of molybdenum (Mo), or an alloy of molybdenum such as molybdenum tantalum (MoTa) or molybdenum tungsten (MoW). Thereafter, by the photoresist step, the gate 132, the source 143 and the drain 144 of island shapes are formed. The state illustrated in FIG. 6C is thus obtained.

Impurities are doped into the polysilicon layer 131 (step S4). At step S4, the polysilicon layer 131 is doped with impurities while the gate 132 serves as a mask. Subsequently, the polysilicon layer 131 is activated (step S5). At step S5, the polysilicon layer 131 is heated for activation. The heating is performed in, for example, an electric furnace. Moreover, an annealing step using excimer laser may also be employed for the heating. The heating is performed with a temperature which would not deform the insulating substrate 111. The heating temperature is selected in a range from 300° C. to 600° C., for example.

Next, the polysilicon layer 131 is hydrogenated (step S6). For example, at step S6, plasma hydrogenation is carried out, for example (hydrogenation step). That is, gas containing hydrogen is caused to flow in a container with pressure reduced by a vacuum pump to 1 Torr or lower to generate hydrogen plasma by high frequency discharge or the like, in which the polysilicon layer 131 is subjected to a heating process.

Next, the oxide-semiconductor layer 141 is formed (step S7). At step S7, an oxide semiconductor is deposited. The island step is performed on the deposited oxide semiconductor film. The oxide semiconductor may be, for example, IGZO which is a compound of indium, gallium, zinc, oxygen and the like. An oxide semiconductor composed of indium (In), stannum (Sn), zinc (Zn) and oxygen (O) may be employed. The state illustrated in FIG. 6D is thus obtained. A part of the semiconductor oxide layer 141, i.e., one end thereof in the scanning line direction, is formed on the source 143. The other end of the semiconductor oxide layer 141 in the scanning line direction is formed on the drain 144. A portion between one end and the other end is formed on the first-gate-insulating layer 112. The oxide-semiconductor layer 141 is formed between the source 143 and the drain 144 like as the bridge.

Next, the second-gate-insulating layer 114 is formed (step S8). The state illustrated in FIG. 7A is thus obtained. A part of the second-gate-insulating layer 114 is formed on the gate 132, the source 143, the drain 144 and the oxide-semiconductor layer 141. The other part of the second-gate-insulating layer 114 is formed on the first-gate-insulating layer 112. The contact holes 1331 and 1341 to the polysilicon layer 131 and the contact hole 1441 to the drain 144 are formed (step S9). At step S9, after a resist film is applied, a process of leaving the resist film only at a necessary portion after patterning by the exposure device is performed. Thereafter, etching is performed by dry etching to form a contact hole. Here, as the degree of etching varies depending on the chemical composition of the film, it is necessary to penetrate the first-gate-insulating layer 112 and the second-gate-insulating layer 114 at portions where the contact holes 1331 and 1341 are formed, for example. In particular, in the case where the first-gate-insulating layer 112 and the second-gate-insulating layer 114 are made of different materials, the wall surfaces may have different angles because of their different pacing of etching. It is noted that the contact holes 1331 and 1341 are holes extending from the upper surface of the second-gate-insulating layer 114 to the upper surface of the polysilicon layer 131. The contact hole 1441 is a hole extending from the upper surface of the second-gate-insulating layer 114 to the upper surface of the drain 144.

The source 133 and drain 134 of the first transistor 13 as well as the gate 142 of the second transistor 14 are formed (step S10). At step S10, the sputtering method or the like is used to deposit the second metal layer 115. The second metal layer 115 is composed of molybdenum (Mo), or an alloy of molybdenum such as molybdenum tantalum (MoTa) or molybdenum tungsten (MoW). Thereafter, by the photoresist step, the source 133, the drain 134 and the gate 142 are formed. The state illustrated in FIG. 7B is thus obtained. A part of the source 133 is connected to the polysilicon layer 131 through the contact hole 1331. A part of the drain 134 is connected to the polysilicon layer 131 through the contact hole 1341.

As described above, since the scanning line SL is a part of the first metal layer 113, the scanning line SL is formed at step S3. That is, the step of forming the scanning line (scan line) SL may be regarded as same as the step of forming the first metal layer 113. Moreover, since the signal line DL and the power line VL are a part of the second metal layer 115, the signal line DL and the power line VL are formed at step S10. That is, the step of forming the signal line (data line) DL and the power line VL may be regarded as same as the step of forming the second metal layer 115. A part of the power line VL is connected to the drain 144 through the contact hole 1441.

According to the present embodiment, the following effects are produced. After the hydrogenation step (step S6) included in the step of forming the first transistor 13, the oxide-semiconductor layer 141 which will serve as a channel for the second transistor 14 is formed (step S7). This can reduce the oxide-semiconductor layer 141 being exposed to hydrogen plasma. When the oxide-semiconductor layer 141 is exposed to hydrogen plasma, oxygen contained in the oxide-semiconductor layer 141 reacts with hydrogen. Then, the amount of oxygen contained in the oxide-semiconductor layer 141 is decreased. This lowers the electric resistance of the oxide-semiconductor layer 141, causing the second transistor 14 to have the normally-on characteristic. According to the present embodiment, however, the possibility of the oxide-semiconductor layer 141 being exposed to hydrogen plasma is reduced, which suppresses degradation in the characteristic of the oxide-semiconductor layer 141. This can therefore suppress the second transistor 14 having the normally-on characteristic. In the case where the oxide thin film transistor is used for a purpose where normally-on is not preferable, a device indicating the normally-on characteristic would be a defective product. According to the present embodiment, however, the second transistor 14 may be prevented from having the normally-on characteristic, which suppresses reducing in yield of the semiconductor device 110.

The second transistor 14 is of a top-gate staggered type. The need for a contact hole for connecting the source 133 or drain 134 of the first transistor 13 and the gate 142 of the second transistor 14 is eliminated. This makes is possible to suppress the plane area necessary for forming the semiconductor device 110. As a result, the number of thin film transistors that can be integrated in a pixel may be increased. A more compact pixel circuit with the same logical configuration may be attained, which can enhance the precision. Furthermore, the aperture ratio in a transparent panel may be improved.

It is further possible to reduce the number of processes and to suppress the manufacturing cost, because the semiconductor device 110 has a two-layered metal structure including the first metal layer 113 and the second metal layer 115.

Embodiment 2

In the present embodiment, a configuration will be described in which a region having a locally high hydrogen concentration is formed in the vicinity of the interfaces of the first-gate-insulating layer 112 and the oxide-semiconductor layer 141.

FIGS. 8A to 8D and 9A to 9B are cross-sectional views illustrating the manufacturing procedure for the semiconductor device 110 according to Embodiment 2. As in Embodiment 1, the polysilicon layer 131 is formed on the insulating substrate 111 (FIG. 8A), and thereafter the first-gate-insulating layer 112 is formed on the insulating substrate 111 and the polysilicon layer 131 (FIG. 8B). In Embodiment 2, the first-gate-insulating layer 112 is composed of $SiO_x$.

Next, the gate 132 of the first transistor 13 as well as the source 143 and the drain 144 of the second transistor 14 are formed on the first-gate-insulating layer 112, the steps S4 and S5 as described earlier are performed, and then the hydrogenation step is carried out (FIG. 8C). In the hydrogenation step, hydrogen plasma with the process temperature of 390° C., the hydrogen gas pressure of 400 Pa and the RF electric density of 1.3 W/cm$^2$ is used, and the time for radiating hydrogen plasma (hydrogenation process time) is set as 15 or 30 minutes.

After the hydrogenation step, IGZO as the oxide-semiconductor layer 141 is sputtered and patterned, to form an IGZO layer. In the present embodiment, IGZO as the oxide-semiconductor layer 141 is formed to have a film thickness of 70 nm by the sputtering method. Thereafter, under the atmospheric pressure, annealing is performed at 400° C. for one hour. As illustrated in FIG. 8D, on the plane where the gate 132, source 143, drain 144 and the layer of the same level as those are absent, a region with high hydrogen concentration is formed in the vicinity of the interfaces of the first-gate-insulating layer 112 and the oxide-semiconductor layer 141. It is estimated that such the layer structure occurs because hydrogen plasma tend not to transmit through the gate 132, source 143, drain 144 and the layer of the same level.

The region having high hydrogen concentration is constituted by a first-gate-insulating layer containing high-concentration hydrogen 211 and an oxide-semiconductor layer containing high-concentration hydrogen 212. Here, first-gate-insulating layer containing high-concentration hydrogen 211 is formed in the vicinity of the interface with the oxide-semiconductor layer 141 in the first-gate-insulating layer 112, representing the region (layer) which has the maximum (locally maximum) hydrogen concentration. Moreover, the oxide-semiconductor layer containing high-concentration hydrogen 212 is formed in the vicinity of the interface with the first-gate-insulating layer 112 in the oxide-semiconductor layer 141, representing the region (layer) which has the maximum (locally maximum) hydrogen concentration.

It is noted that the region with high hydrogen concentration may be constituted by either one of the first-gate-insulating layer containing high-concentration hydrogen 211 and the oxide-semiconductor layer containing high-concentration hydrogen 212 according to the first-gate-insulating layer 112, the material for the oxide-semiconductor layer 141 and the condition of the hydrogenation process.

Figure 9A:
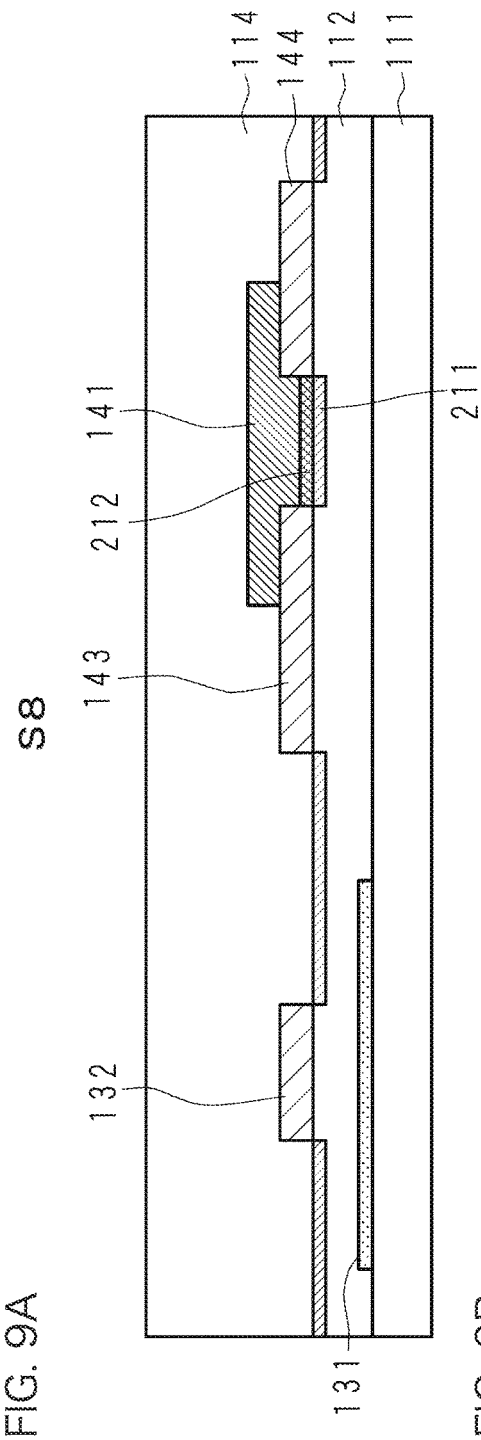
FIGS. 9A and 9B are cross-sectional views illustrating a manufacturing procedure for the semiconductor device according to Embodiment 2.
Figure 9B:
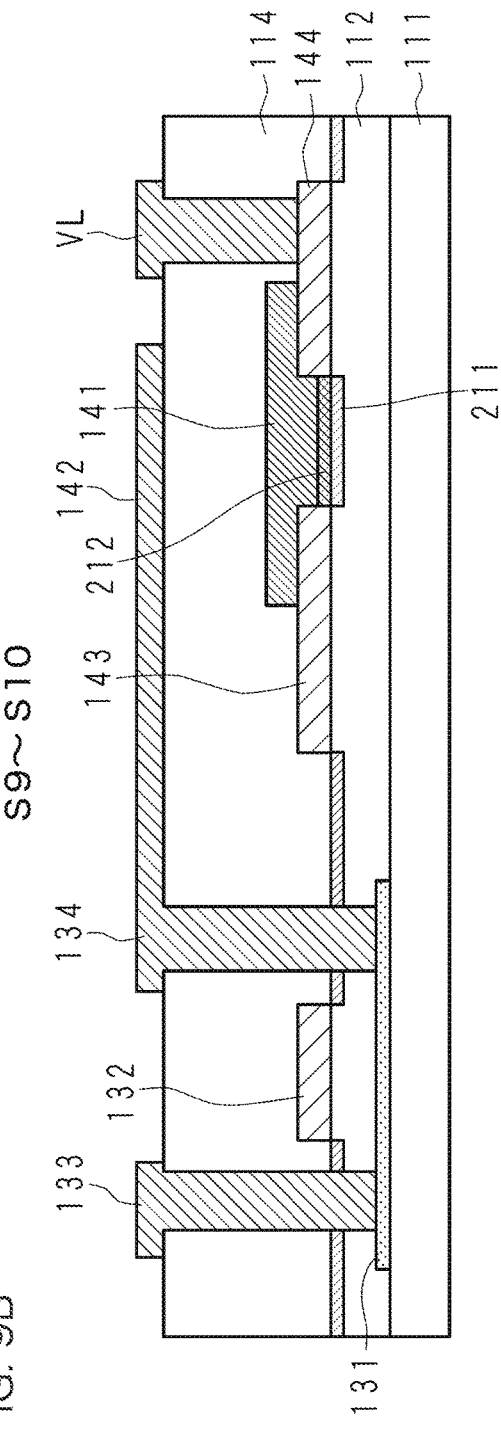

Next, with the procedure similar to that in Embodiment 1, the second-gate-insulating layer 114 is formed (FIG. 9A), and the source 133 and drain 134 of the first transistor 13 as well as the gate 142 of the second transistor 14 are formed, for example (FIG. 9B).

The inventors measured the distribution of hydrogen concentration in the depth direction from the surface of the oxide-semiconductor layer 141 toward the first-gate-insulating layer 112 after the hydrogenation step by the secondary ion mass spectrometry (SIMS) method in order to clarify the detailed distribution of hydrogen concentration. The SIMS analysis device used for measurement is PHI ADEPT1010. For analysis, ion beam with Cs ions (Cs$^+$) accelerated to 3 keV is used.

Figures 10A, 10B, 10C:
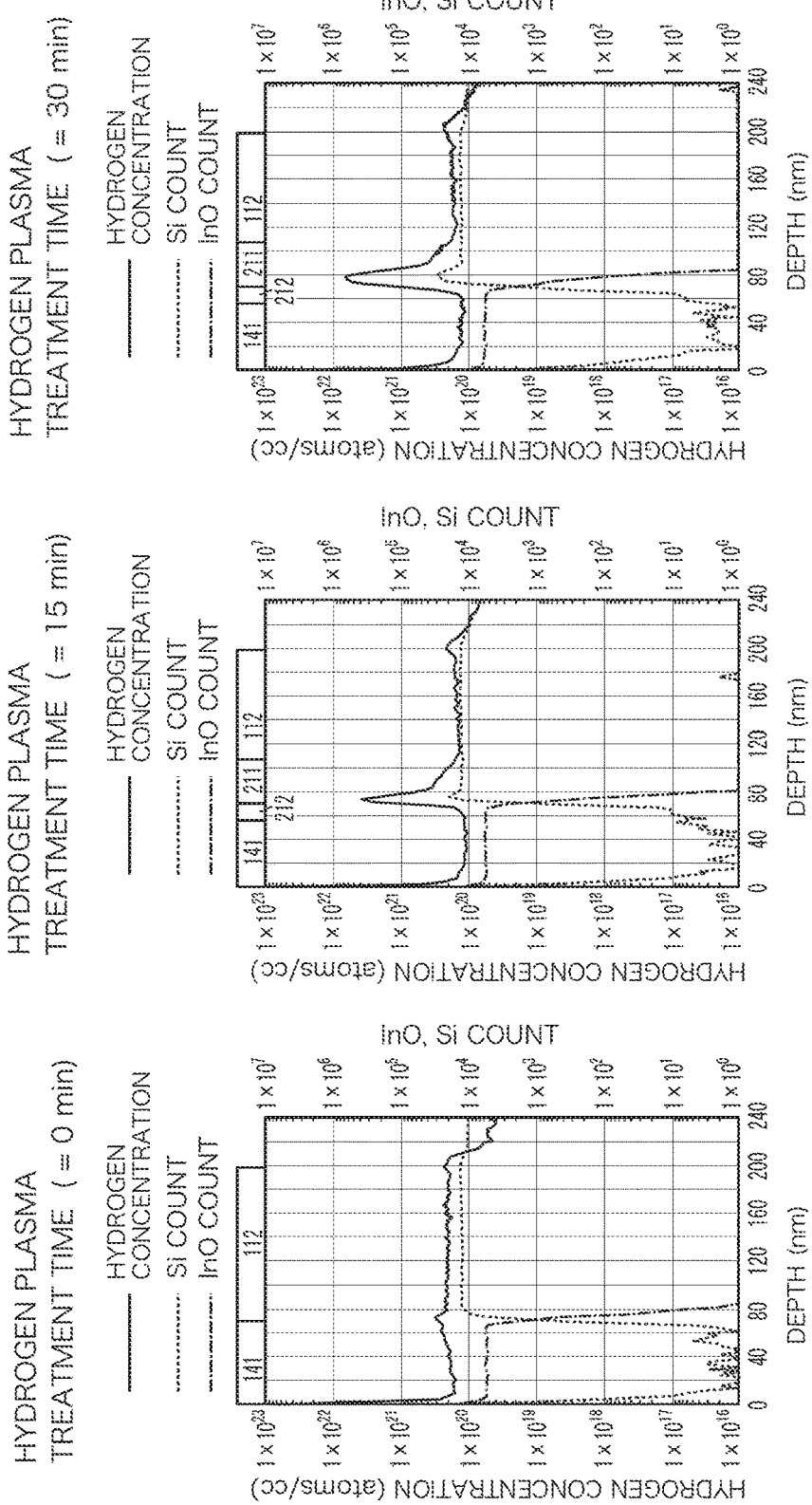
FIGS. 10A-10C are graphs illustrating analysis results for element concentrations in the depth direction based on the SIMS analysis.

FIGS. 10A to 10C indicate graphs illustrating analysis results for element concentrations in the depth direction based on the SIMS analysis. FIG. 10A is a result of analysis for a sample with hydrogen plasma treatment time of zero, illustrated as a comparative example. FIG. 10B illustrates a sample with hydrogen plasma treatment time of fifteen minutes, and FIG. 10C illustrates a sample with hydrogen plasma treatment time of thirty minutes. The horizontal axis in each graph represents a distance in the depth direction from the surface, the left vertical axis represents hydrogen concentration, and the right vertical axis represents the counted numbers of Si and InO. From the distribution of the counted numbers of Si and InO, it is possible to discriminate the interfaces of the IGZO layer and the SiO$_x$ layer. It can thus be estimated that the interfaces of the IGZO layer and the SiO$_x$ layer are exist at the depth around which the counted number of Si and the counted number of InO cross each other. In the vicinity of the surface, hydrogen, Si and InO all indicate high values. This may possibly be caused by contamination at the time of measurement, and thus is excluded from the following description.

Each of FIGS. 10B and 10C where the hydrogenation process is performed indicates one peak having significantly high hydrogen concentration of $1 \times 10^{21}$ cm$^{-3}$ or higher. Moreover, it has become clear that the peak is exist at the thickness exceeding 40 nm. The peak value is a value 10 times higher or more than the value of the typical hydrogen concentration ($1 \times 10^{20}$ cm$^{-3}$ to $2 \times 10^{20}$ cm$^{-3}$) in a layer such as the IGZO layer or the SiO$_x$ layer.

Moreover, the peak of hydrogen concentration corresponds to the depth around the area where the counted number of Si and the counted number of InO cross each other. Thus, the area around the interfaces of the oxide-semiconductor layer containing high-concentration hydrogen 212 (IGZO layer) and the first-gate-insulating layer containing high-concentration hydrogen 211 (SiO$_x$ layer) has high hydrogen concentration. It has further become clear that the peak in the distribution of hydrogen concentration in the depth direction is exist with the thickness of approximately 40 nm around the maximum value.

Meanwhile, FIG. 10A where no hydrogenation process is performed indicates no peak of hydrogen concentration around the interfaces of the oxide-semiconductor layer (IGZO layer) and the first-gate-insulating layer (SiO$_x$ layer), and therefore neither the first-gate-insulating layer containing high-concentration hydrogen 211 nor the oxide-semiconductor layer containing high-concentration hydrogen 212 is exist.

Furthermore, as a result of measuring the sheet resistance for the oxide-semiconductor layer (including oxide-semiconductor layer containing high-concentration hydrogen) in these samples, the sample not subjected to the hydrogenation process has the sheet resistance of $1.90 \times 10^8$ Ω/sq, the sample subjected to 15-minute hydrogenation process has the sheet resistance of $8.09 \times 10^7$ Ω/sq, and the sample subjected to 30-minute hydrogenation process has the sheet resistance of $3.33 \times 10^6$ Ω/sq. It has been found from these results that the sheet resistance value is decreased as the time for the hydrogenation process is increased.

A possible reason for lowering in the sheet resistance value of the oxide-semiconductor layer is as follows. Oxygen deficiency is formed in the oxide-semiconductor layer containing high-concentration hydrogen 212 due to the reducing action of hydrogen. As a result, it is presumable that carriers, more specifically free electrons, are generated in the oxide-semiconductor layer containing high-concentration hydrogen 212, lowering the sheet resistance value. It is thus possible that the amount of lowered sheet resistance value varies depending on the hydrogen concentration.

Figure 11:
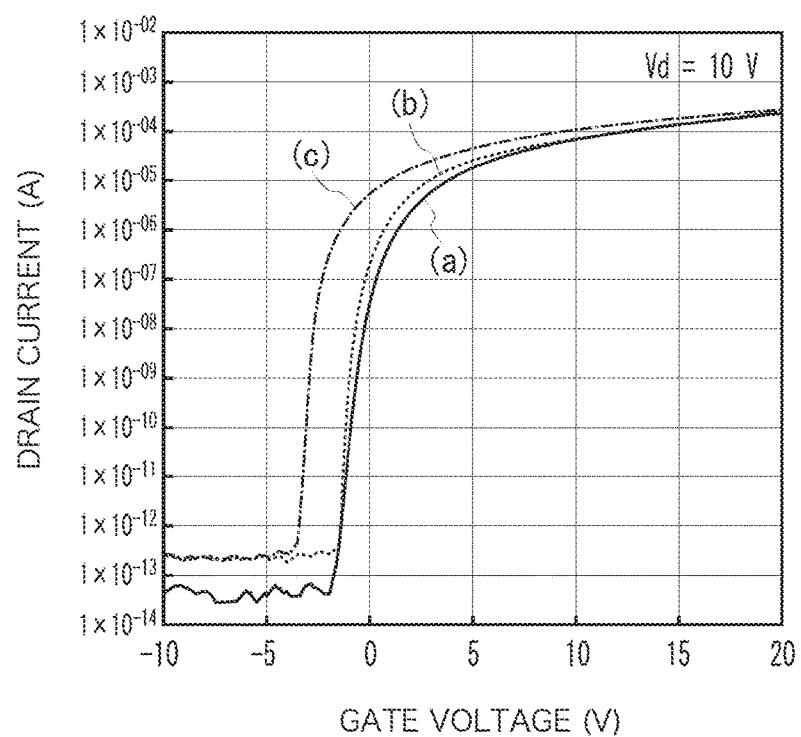
FIG. 11 is a graph illustrating measurement results for Id-Vg characteristics of IGZO-TFT prepared under the processing conditions in FIGS. 10A-10C.

FIG. 11 is a graph illustrating a measurement result for the Id-Vg characteristics of IGZO-TFT prepared under the processing conditions in FIGS. 10A-10C. The horizontal axis represents the gate voltage Vg (V), whereas the vertical axis represents the drain current Id (A). The lines denoted as reference codes (a) to (c) in the graph indicate the Id-Vg characteristics of IGZO-TFT prepared under the processing conditions in FIGS. 10A-10C. For the lines denoted as reference codes (a) and (b) in the graph, it can be seen that, when the gate voltage Vg is gradually increased, the drain current Id starts to increase at around −1.5 V, turning on the transistor. Meanwhile, it can be seen that, for the line denoted as a reference code (c) in the graph, the transistor is turned on at the gate voltage Vg of around −3.5 V.

It is estimated that the characteristic indicated by the line denoted as (c) in the graph is mainly caused by the generation of excessive carriers in the oxide-semiconductor layer containing high-concentration hydrogen. In the case where the transistor having such a characteristic is used as a switching element, the drain current value at the gate voltage of 0 V is too high to secure a sufficient on/off ratio of the transistor. It is thus difficult for the transistor having the characteristic indicated by the reference code (c) to be used as a switching element.

From additional experiment, the following findings are obtained. In the hydrogen concentration distribution in the depth direction observed by the SIMS measurement, when the peak value of hydrogen concentration is $1 \times 10^{22}$ cm$^{-3}$ or higher, the gate voltage Vg at which the transistor starts to be turned on is −10 V or lower, so that the transistor cannot be used as a switching element.

Under the present conditions, the required time for the hydrogenation process is fifteen minutes or longer in order for the polysilicon (LTPS) TFT which is the first transistor to operate in a preferable manner. While the first transistor (FIG. 10A) which has no hydrogenation process time is defective, the first transistor as indicated in FIGS. 10B and 10C have preferable TFT characteristics.

Thus, in order to use a polysilicon thin film transistor which is the first transistor and IGZO-TFT which is the second transistor as switching elements, it is desirable that the peak value of hydrogen concentration in the vicinity of the interfaces of the $SiO_x$ layer and the IGZO layer is equal to or higher than $1\times10^{21}$ cm$^{-3}$ and lower than $1\times10^{22}$ cm$^{-3}$. When the base hydrogen concentration is constant ($1\times10^{20}$ cm$^{-3}$), it is desirable that the hydrogen concentration peak value is 10 times or more and less than 100 times.

More preferably, the peak value of hydrogen concentration in the vicinity of the interfaces of the $SiO_x$ layer and the IGZO layer is desirably equal to or higher than $1\times10^{21}$ cm$^{-3}$ and lower than $8\times10^{21}$ cm$^{-3}$. When the base hydrogen concentration is constant ($1\times10^{20}$ cm$^{-3}$), it is desirable that the hydrogen concentration peak value is 10 times or more and less than 80 times. When the peak value of hydrogen concentration is under the condition described earlier, both of the TFT characteristics of the first transistor and the second transistor may be made preferable.

Embodiment 3

Figure 12:
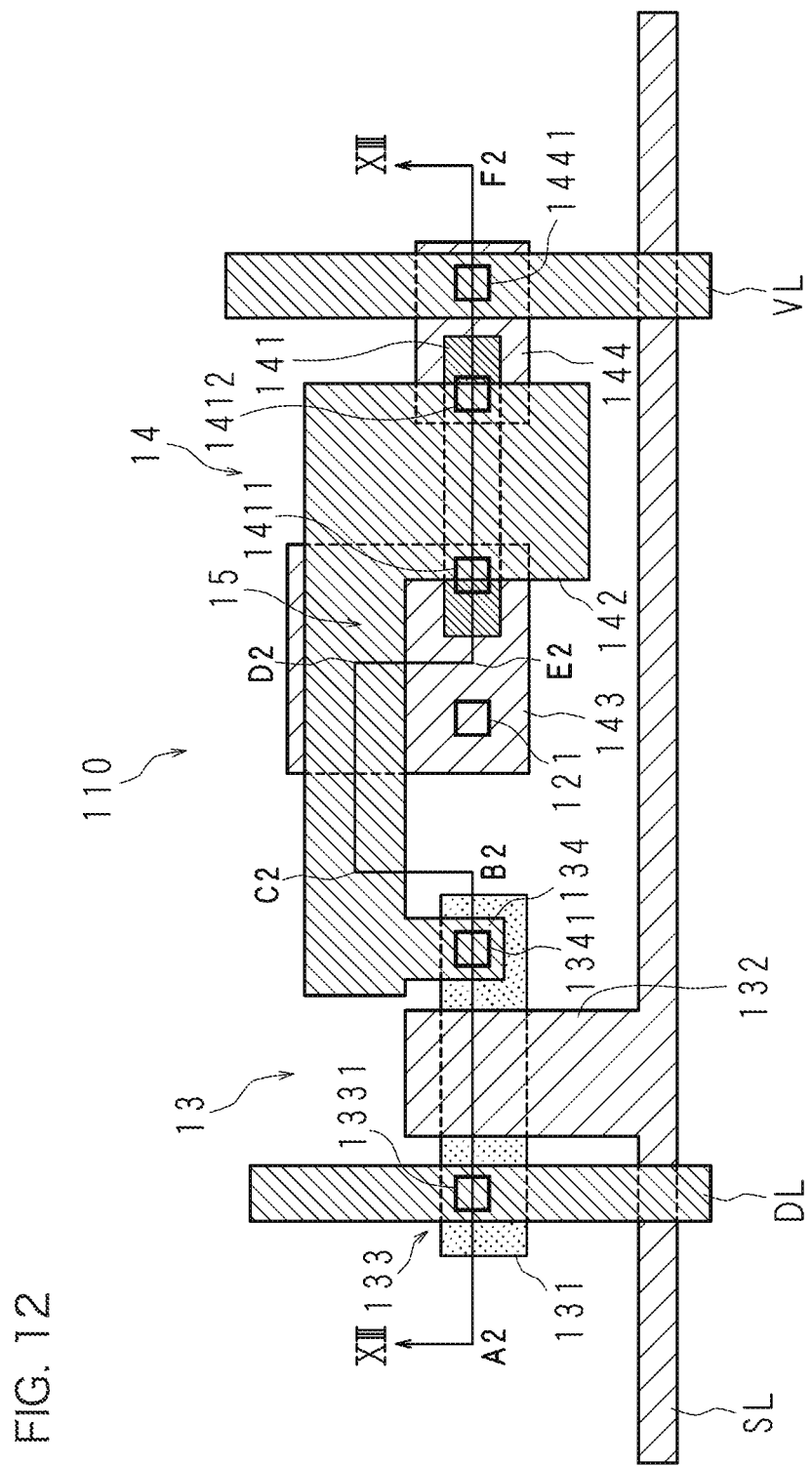
FIG. 12 is a plan view illustrating a configuration example of a semiconductor device included in a pixel drive circuit according to Embodiment 3.
Figure 13:
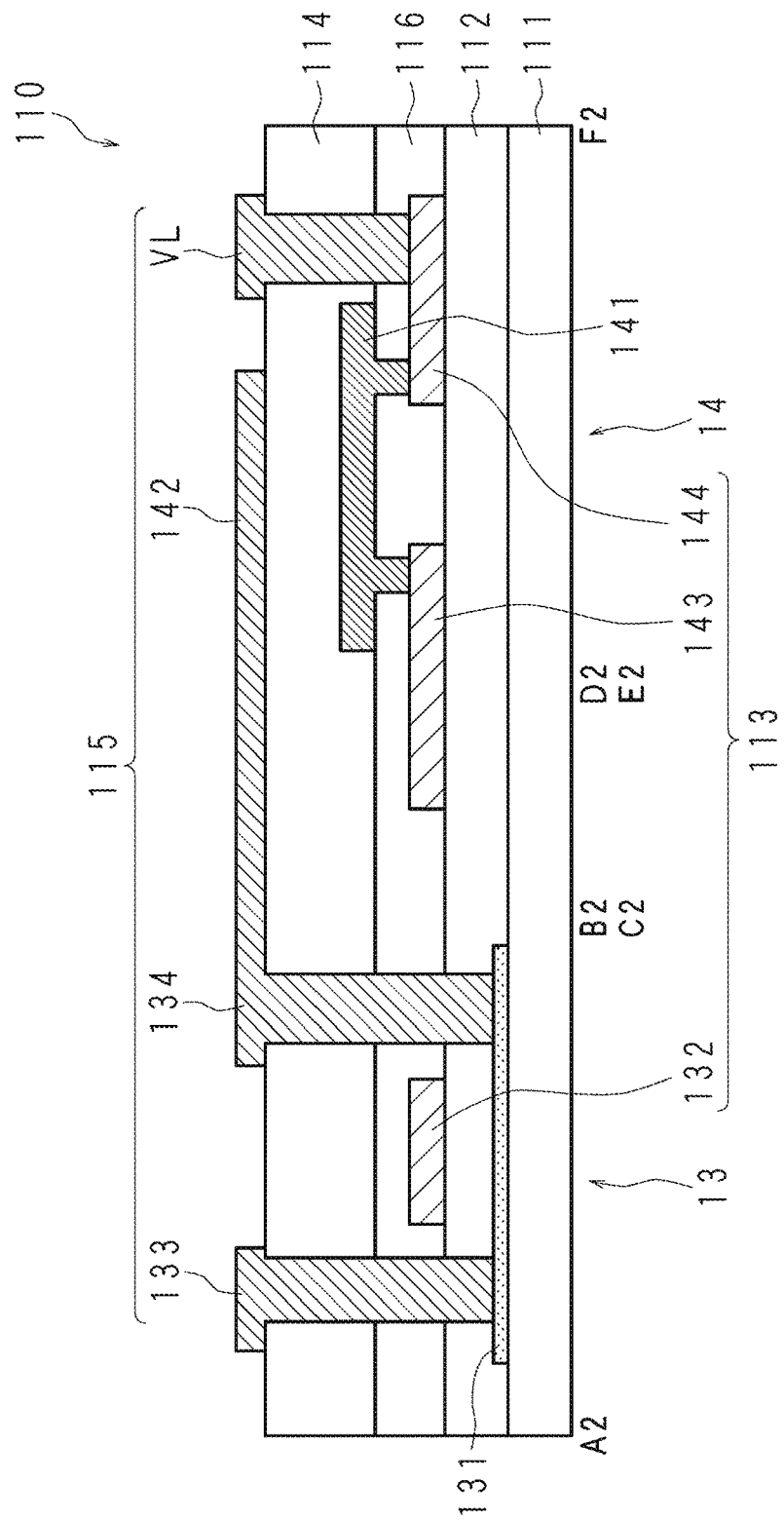
FIG. 13 is a cross-sectional view taken along the section line XIII-XIII in FIG. 12.

The present embodiment relates to a configuration where an insulating interlayer is formed between the first-gate-insulating layer 112 and the second-gate-insulating layer 114. FIG. 12 is a plan view illustrating a configuration example of a semiconductor device 110 included in a pixel drive circuit. FIG. 13 is a cross-sectional view taken along the section line XIII-XIII in FIG. 12. In FIGS. 12 and 13, configuration parts similar to those in Embodiment 1 illustrated in FIGS. 3 and 4 are denoted by the same reference codes and will not be described here.

In the present embodiment, as illustrated in FIG. 13, an insulating interlayer 116 is formed on the first-gate-insulating layer 112 and the first metal layer 113. The second-gate-insulating layer 114 is formed on the insulating interlayer 116. Furthermore, the second metal layer 115 is formed on the second-gate-insulating layer 114. The oxide-semiconductor layer 141 in the second transistor 14 is formed on the insulating interlayer 116. The oxide-semiconductor layer 141 and the source 143 are electrically connected to each other through the contact hole 1411. The oxide-semiconductor layer 141 and the drain 144 are electrically connected to each other through the contact hole 1441. In the present embodiment, the second transistor 14 is a top-gate staggered thin film transistor.

Figure 14:
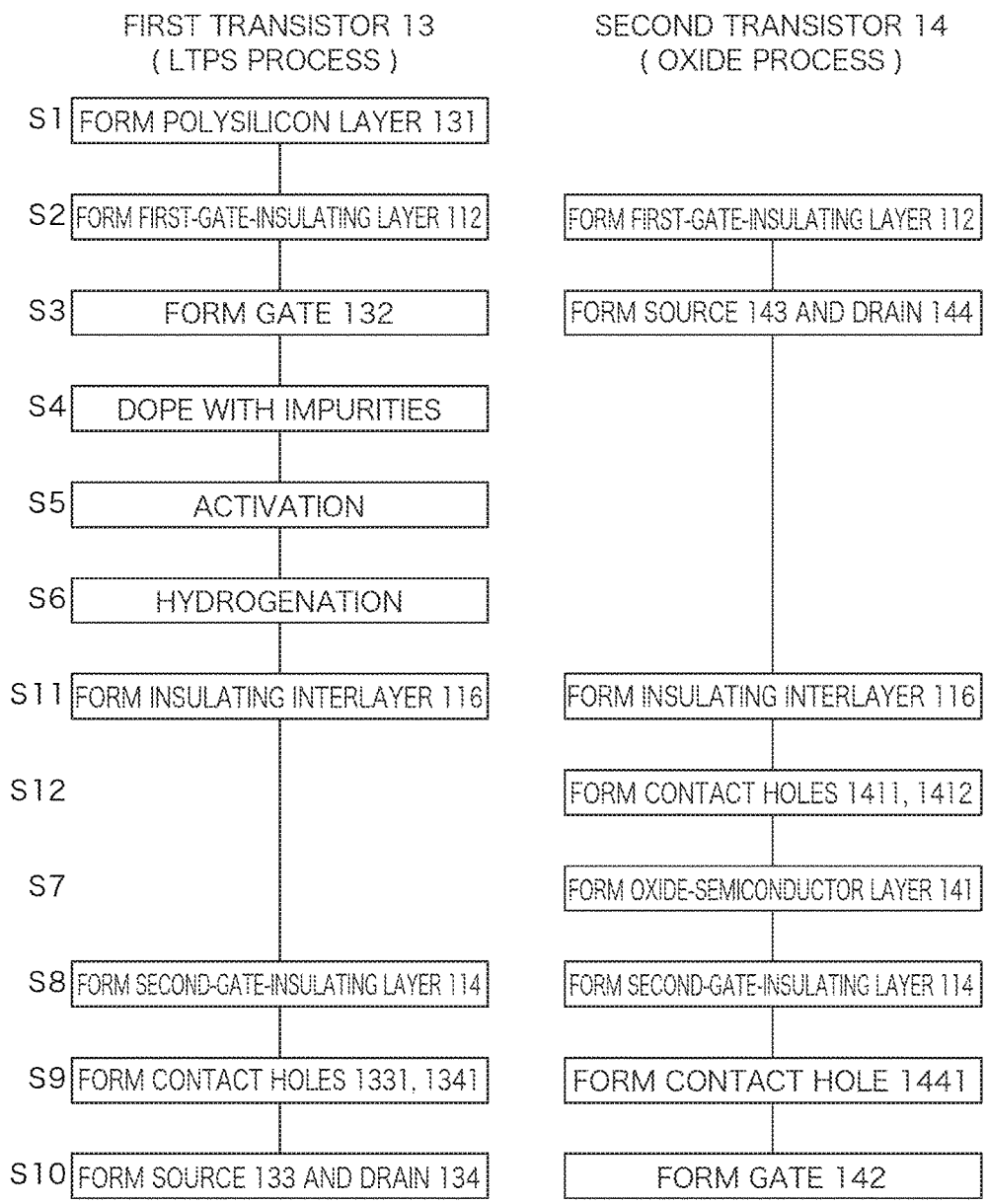
FIG. 14 is a flowchart illustrating a manufacturing procedure for a semiconductor device according to Embodiment 3.

A manufacturing procedure for the semiconductor device 110 will now be described. FIG. 14 is a flowchart illustrating a manufacturing procedure for the semiconductor device 110. FIGS. 15A to 15D and 16A to 16C are cross-sectional views illustrating the manufacturing procedure for the semiconductor device 110. The cross-sections in FIGS. 15A to 15D and 16A to 16C are similar to the cross-section in FIG. 13. In FIG. 14, procedures similar to those in FIG. 5 will be denoted by the same step numbers and will not be described. Also for FIGS. 15A to 15D and 16A to 16C, details similar to those in FIGS. 6A to 6D and 7A to 7B will not be described here.

Figure 15A:
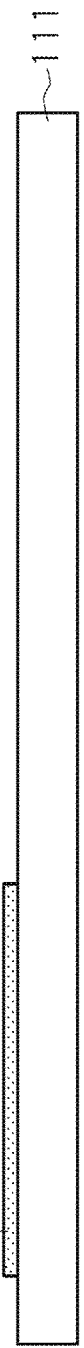
FIGS. 15A-15D are cross-sectional views illustrating a manufacturing procedure for the semiconductor device.
Figure 15B:
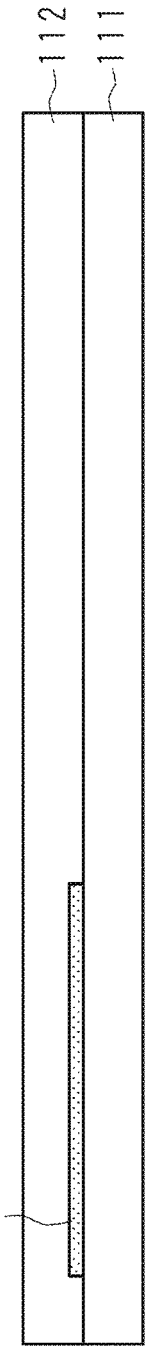
Figure 15C:
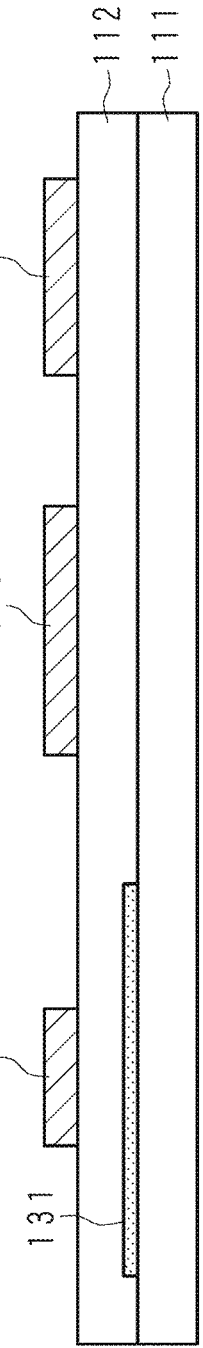
Figure 15D:
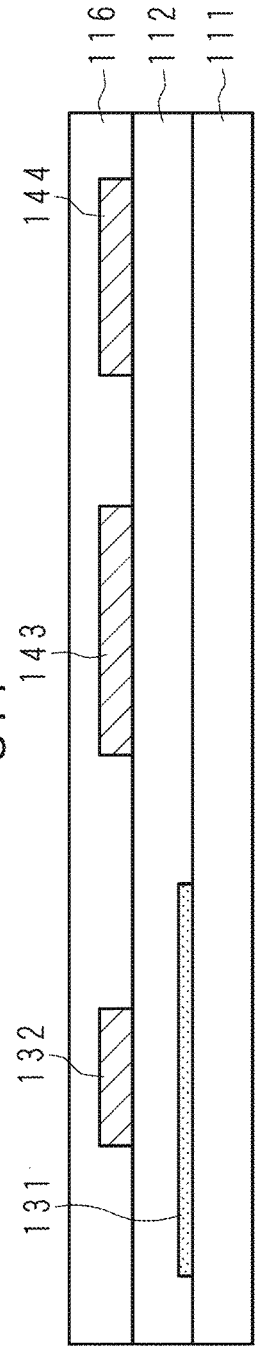

In the present embodiment, after the polysilicon layer 131 included in the first transistor 13 is hydrogenated (step S6), the insulating interlayer 116 is formed (step S11). The state illustrated in FIG. 15D is thus obtained.

Next, the contact holes 1411 and 1412 are formed (step S12). The contact hole 1411 is a hole extending from the upper surface of the insulating interlayer 116 to the upper surface of the source 143. The contact hole 1412 is a hole extending from the upper surface of the insulating interlayer 116 to the upper surface of the drain 144. The oxide-semiconductor layer 141 is formed (step S7). The state illustrated in FIG. 16A is thus obtained. A part of the oxide-semiconductor layer 141 is connected to the source 143 through the contact hole 1411. A part of the oxide-semiconductor layer 141 is connected to the drain 144 through the contact hole 1412. The second-gate-insulating layer 114 is formed (step S8). The state illustrated in FIG. 16B is thus obtained. Steps S9 and S10 are executed to obtain the state illustrated in FIG. 16C.

The present embodiment produces the following effects in addition to those produced in Embodiment 1. After the polysilicon layer 131 is hydrogenated (step S6), the insulating interlayer 116 is formed (step S11). Even if the hydrogen used for hydrogenation remains by, for example, being adhered to the surfaces of the source 143 and the drain 144, it is blocked by the insulating interlayer 116 from the oxide-semiconductor layer 141. This can suppress degradation in the characteristic of the oxide-semiconductor layer 141.

Moreover, in the present embodiment, an oxide semiconductor is deposited directly onto the first metal layer 113 where the source 143 and the drain 144 are formed. It is not necessary to form the oxide-semiconductor layer 141 by selective etching. In the selective etching, etchant may deteriorate the characteristic of the first metal layer 113. In the present embodiment, however, the selective etching is unnecessary, making it possible to suppress deterioration in the characteristic of the first metal layer 113.

Embodiment 4

Figure 17:
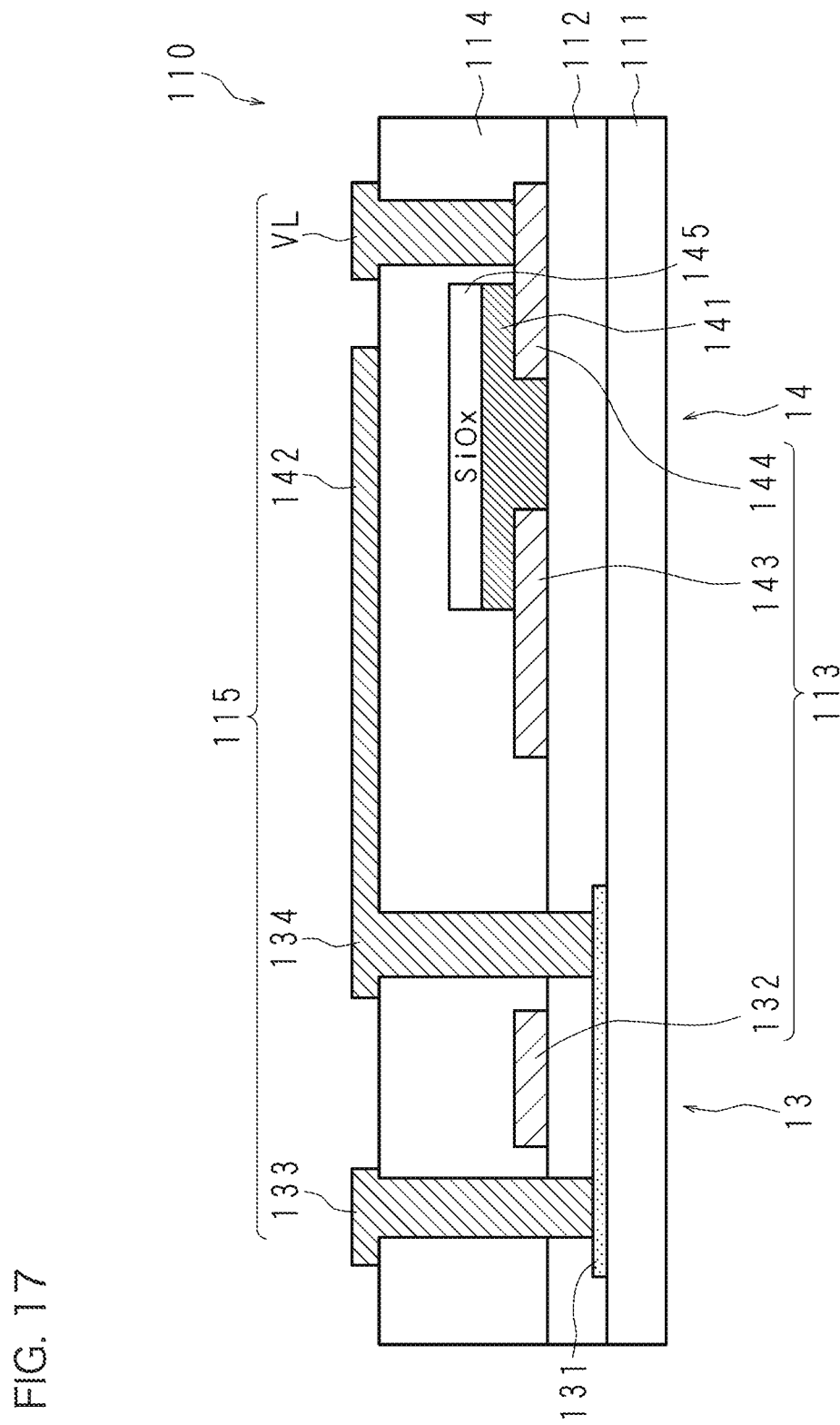
FIG. 17 is a cross-sectional view of a semiconductor device according to Embodiment 4.

FIG. 17 is a cross-sectional view of the semiconductor device 110. The cross-section in FIG. 17 is similar to that in FIG. 4. The present embodiment describes a configuration where an insulating film 145 is formed on the upper surface of the oxide-semiconductor layer 141 in the second transistor 14. The insulating film 145 is formed of $SiO_x$ (silicon oxide). The insulating film 145 is formed after forming the oxide-semiconductor layer 141 (after step S7) and before forming the second-gate-insulating layer 114 (before step S8).

The present embodiment produces the following effects in addition to those produced in Embodiment 1. The insulating film 145 is formed on the upper surface of the oxide-semiconductor layer 141. This can suppress degradation in the characteristic of the oxide-semiconductor layer 141 in the subsequent steps.

Embodiment 5

Figure 18:
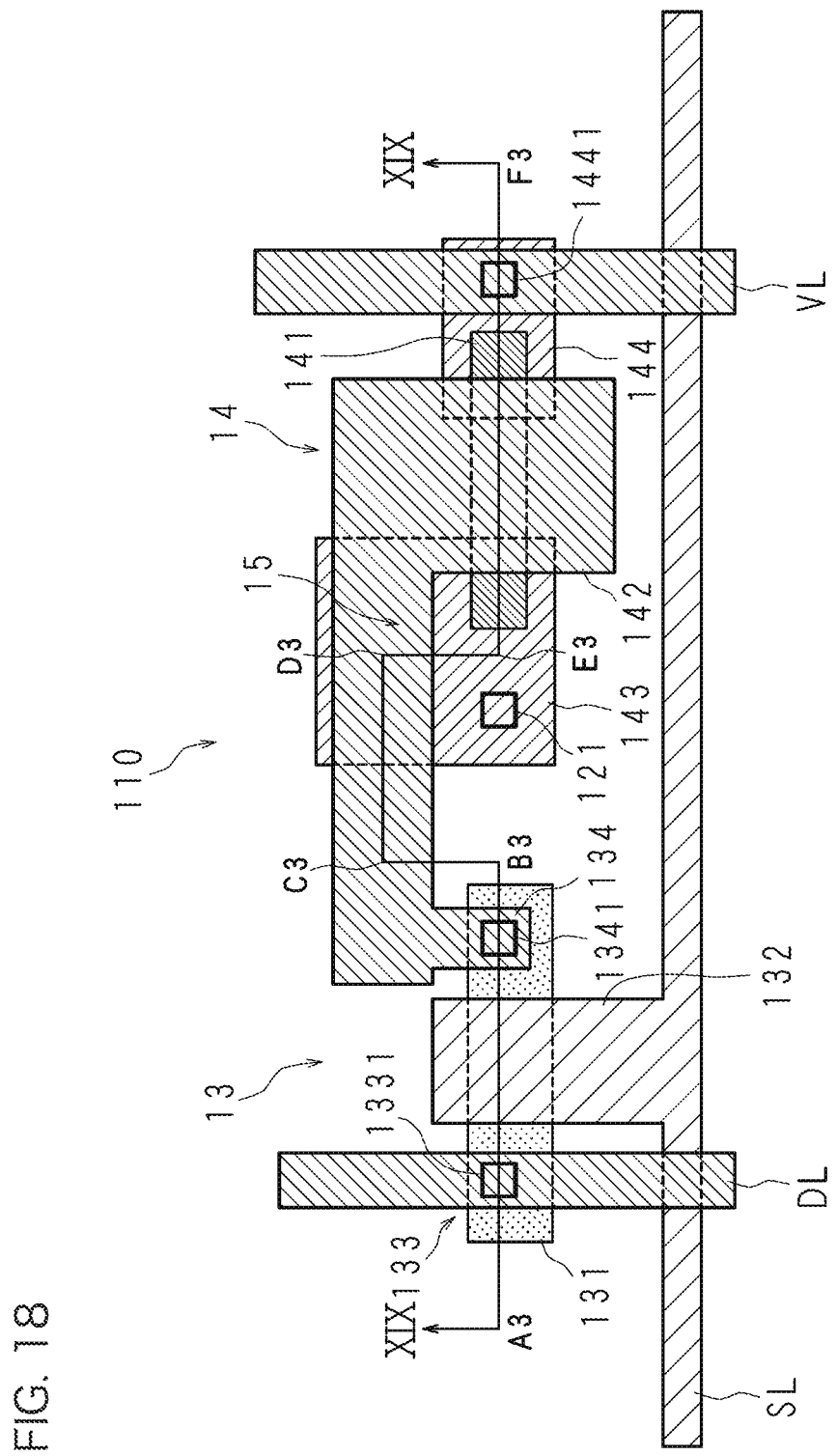
FIG. 18 is a plan view illustrating a configuration example of a semiconductor device included in a pixel drive circuit according to Embodiment 5.
Figure 19:
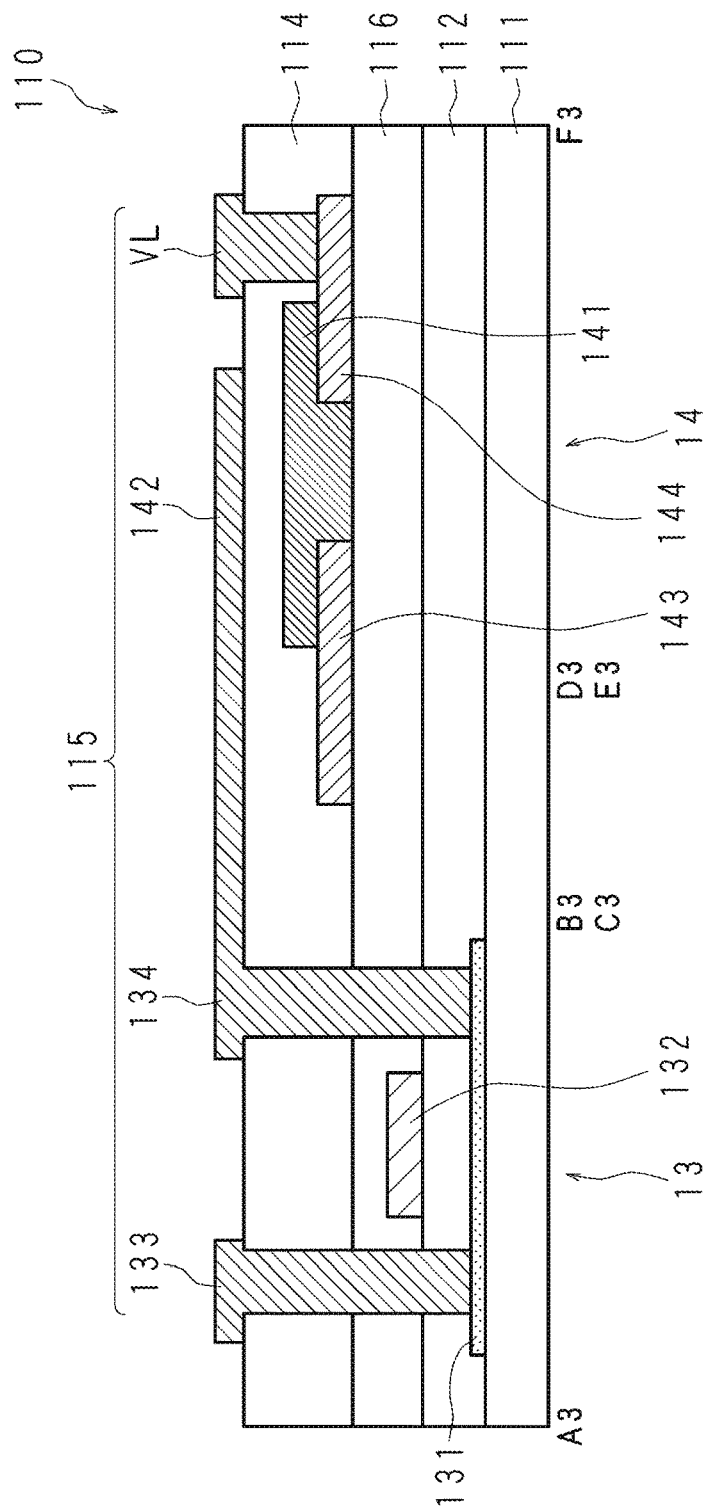
FIG. 19 is a cross-sectional view taken along the section line XIX-XIX in FIG. 18.

FIG. 18 is a plan view illustrating a configuration example of a semiconductor device 110 included in a pixel drive circuit. FIG. 19 is a cross-sectional view taken along the section line XIX-XIX in FIG. 18. In FIGS. 18 and 19, configuration parts similar to those in Embodiment 1 described above are denoted by the same reference codes and will not be described here.

According to the present embodiment, the two-metal structure in Embodiment 1 is changed to a three-metal structure. In Embodiment 1, the gate 132 of the first transistor 13 is formed of the same metal layer as the source 143 and drain 144 of the second transistor 14. In the present embodiment, the gate 132 is formed of a metal layer different from that for the source 143 and drain 144.

Figure 20:
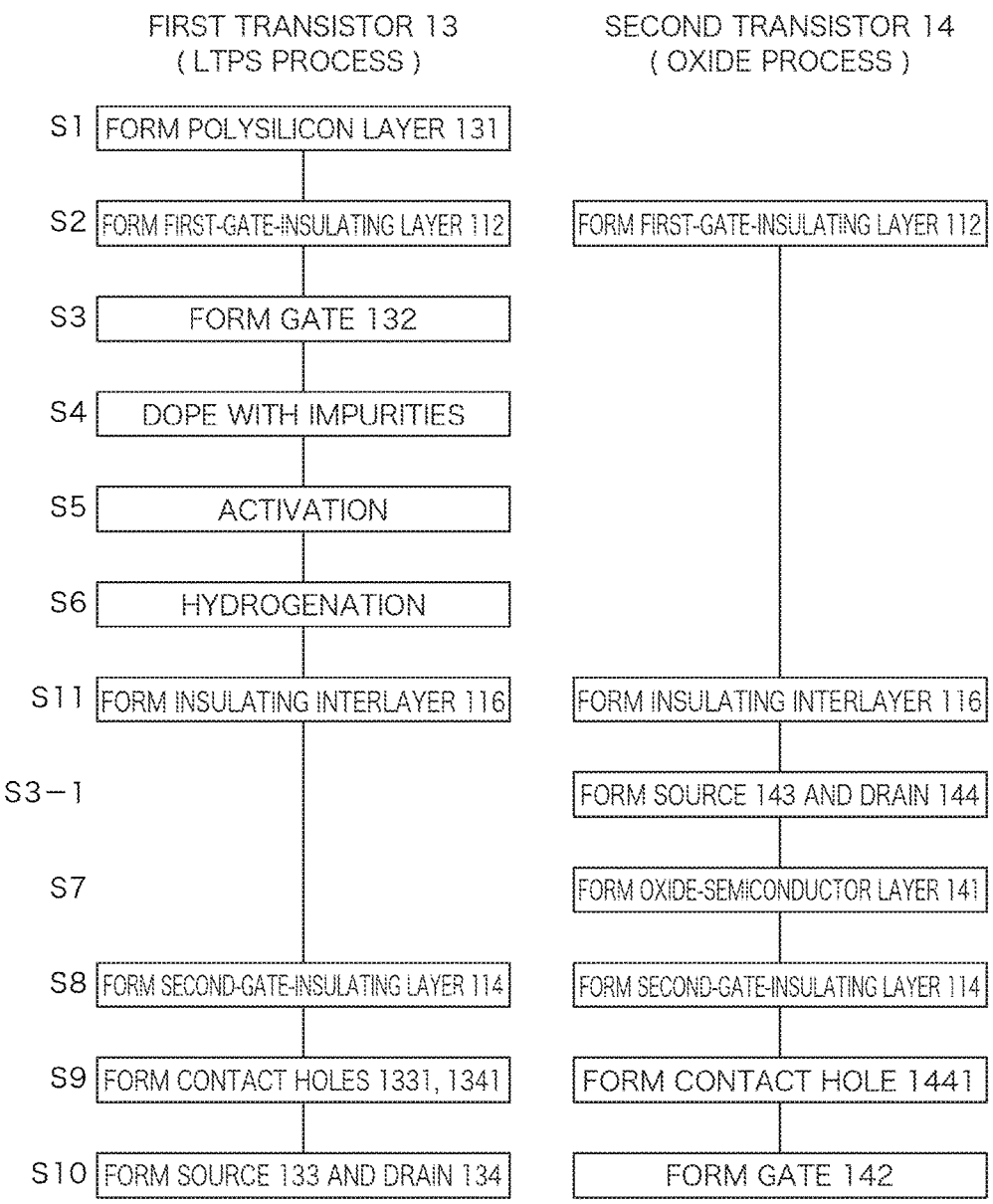
FIG. 20 is a flowchart illustrating a manufacturing procedure for a semiconductor device according to Embodiment 5.

FIG. 20 is a flowchart illustrating a manufacturing procedure for the semiconductor device 110. In FIG. 20, procedures similar to those in FIGS. 5 and 14 will be denoted by the same step numbers and will not be described in detail. In the present embodiment, in forming the gate 132 of the first transistor 13 at step S3, no procedure related to the second transistor 14 is performed. In the present embodiment, after the insulating interlayer 116 is formed (after step S11), the source 143 and drain 144 of the second transistor 14 are formed (step S3-1). Thereafter, steps S7 to S10 are performed. As illustrated in FIG. 20, in the present embodiment, the gate 132 is formed between the first-gate-insulating layer 112 and the insulating interlayer 116. The source 143 and drain 144 are formed on the insulating interlayer 116.

The present embodiment produces the following effects in addition to those produced in Embodiment 1. Because of the three-layer metal structure, the insulating interlayer 116 is formed after the gate 132 of the first transistor 13 is hydrogenated (step S6). The oxide-semiconductor layer 141 is formed on the insulating interlayer 116. Accordingly, even when hydrogen is adhered to the surface of the first-gate-insulating layer 112, the insulating interlayer 116 prevents hydrogen from being in contact with the oxide-semiconductor layer 141. It is thus possible to suppress degradation in the characteristic of the oxide-semiconductor layer 141.

Embodiment 6

Embodiment 6 is a specific example based on Embodiment 5. In the present embodiment, the first-gate-insulating layer 112 and the insulating interlayer 116 are composed of $SiO_x$. The specific process conditions for the hydrogenation step (step S6) in FIG. 20 include the processing temperature of 390° C., the hydrogen gas pressure of 400 Pa and the RF power density of 1.3 W/cm², and the hydrogenation process time is set as fifteen minutes.

Figure 21:
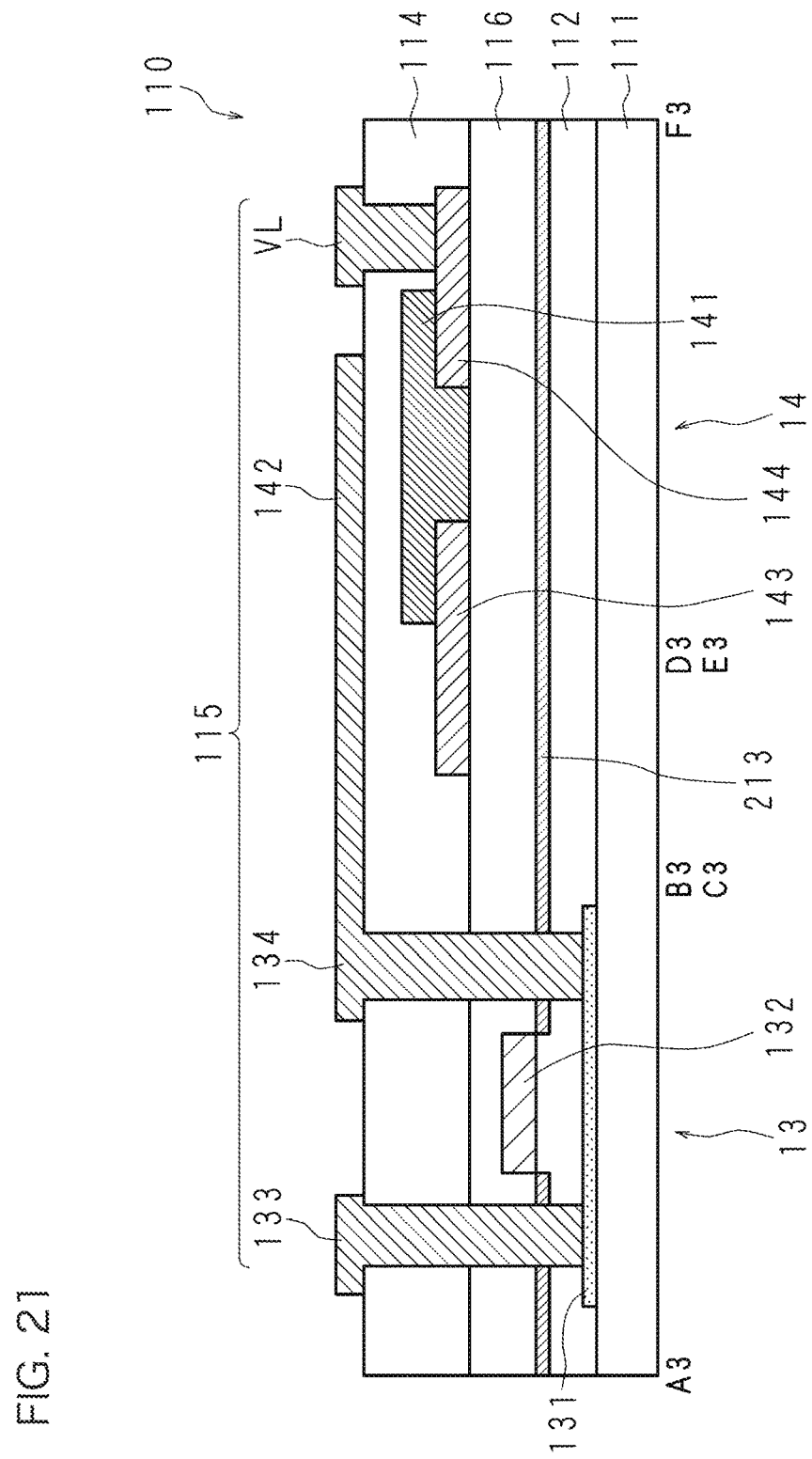
FIG. 21 is a cross-sectional view illustrating a configuration example of a semiconductor device according to Embodiment 6.

FIG. 21 is a cross-sectional view illustrating a configuration example of a semiconductor device 110 according to Embodiment 6. As illustrated in FIG. 21, the first-gate-insulating layer interface region having locally high hydrogen concentration is formed as the first-gate-insulating layer containing high-concentration hydrogen 213.

The hydrogen concentration or structure in the first-gate-insulating layer containing high-concentration hydrogen 213 has become clear in a specified manner by the experiment and analysis described below. In the experiment, after the $SiO_x$ film is deposited on the insulating substrate 111 as the first-gate-insulating layer 112, the gate 132 is formed, impurities are doped and an activation step is performed. Thereafter, the hydrogenation step is carried out. Next, pure water is used for washing, and thereafter $SiO_x$ is deposited to the film thickness of 200 nm as the insulating interlayer 116 at a substrate temperature of 200° C. by the plasma CVD method.

The first-gate-insulating layer containing high-concentration hydrogen 213 is observed in a region where the gate 132 and the layer of the same level as the gate 132 are absent.

Using the sample prepared as described above, the distribution of hydrogen concentration in the depth direction from the surface of the insulating interlayer 116 made of $SiO_x$ toward the inside of the first-gate-insulating layer 112 made of $SiO_x$ is measured by the SIMS method, to find that a region having locally high hydrogen concentration is exist at the interface region of the first-gate-insulating layer 112 and the insulating interlayer 116.

It is found that the peak value of hydrogen concentration in this region is $1\times10^{21}$ cm$^{-3}$ or higher, which is 10 times higher or more than the value of the typical hydrogen concentration ($1\times10^{20}$ cm$^{-3}$ to $2\times10^{20}$ cm$^{-3}$) in a layer such as the first-gate-insulating layer 112 ($SiO_x$) or the insulating interlayer 116 ($SiO_x$).

According to the present embodiment, the second transistor 14 is not affected by hydrogen concentration, and may operate in a preferable manner.

Embodiment 7

Embodiment 7 describes a form where the hydrogenation step at step S6 and the step of forming the insulating interlayer 116 at step S11 are switched from each other in the manufacturing procedure illustrated in FIG. 20.

Figure 22:
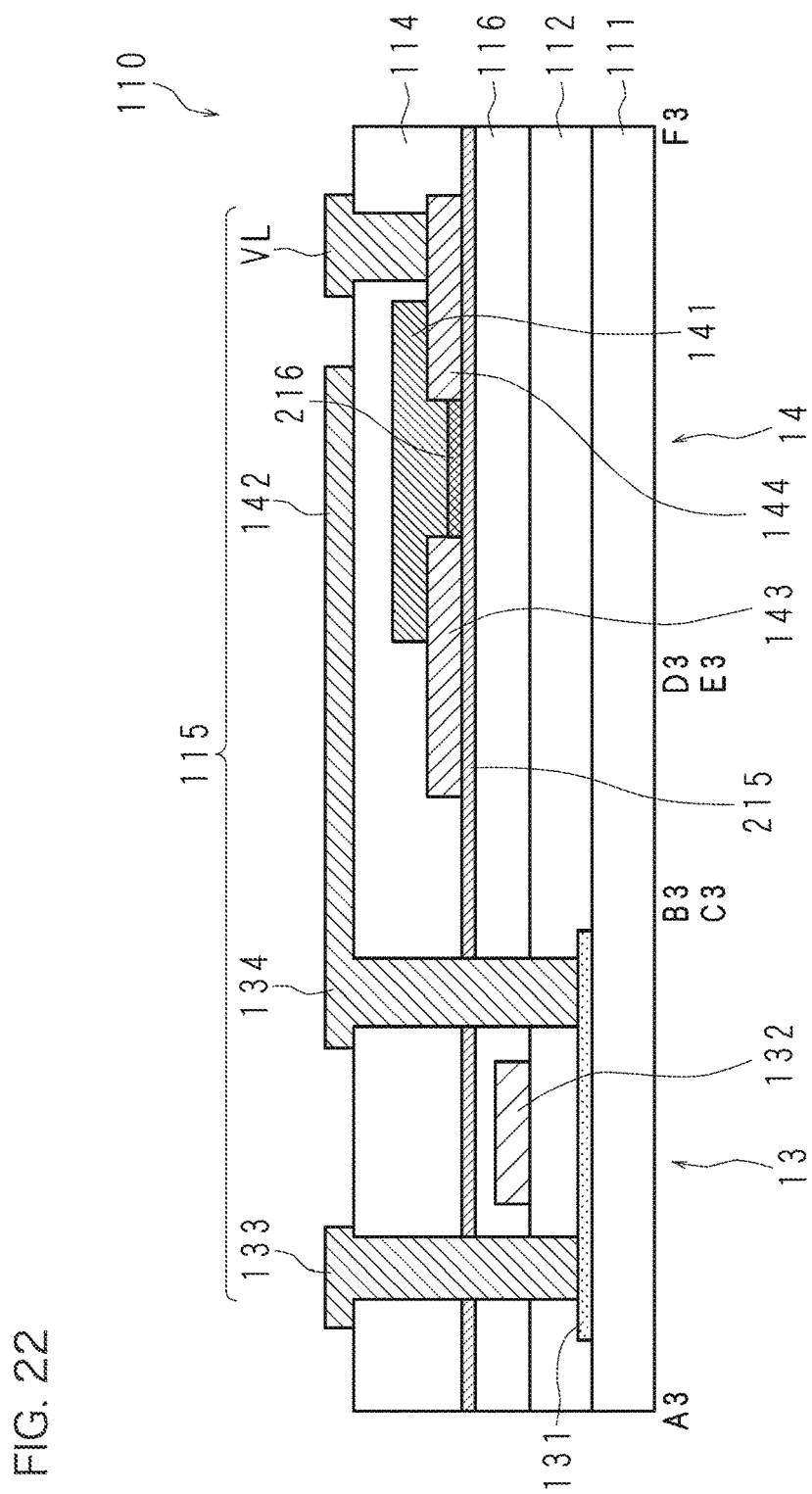
FIG. 22 is a cross-sectional view illustrating a configuration example of a semiconductor device according to Embodiment 7.

FIG. 22 is a cross-sectional view illustrating a configuration example of a semiconductor device 110 according to Embodiment 7. As illustrated in FIG. 22, the second transistor 14 composed of an oxide semiconductor has a layered structure similar to that in Embodiment 2. A region with high concentration of hydrogen is exist at the interfaces of the insulating interlayer 116 and the second-gate-insulating layer 114. After the source 143 and the drain 144 of the second transistor 14 are formed (S3-1), IGZO is formed as the oxide-semiconductor layer 141, and thereafter annealing is performed with atmospheric pressure at 400° C. for one hour.

As a result, a insulating interlayer containing high-concentration hydrogen 215 which is an insulating interlayer region with locally high hydrogen concentration and a oxide-semiconductor layer containing high-concentration hydrogen 216 which is an oxide semiconductor region with locally high hydrogen concentration are formed.

A contact portion between the oxide-semiconductor layer and the insulating interlayer in this sample is subjected to the SIMS analysis. It is found as a result that the hydrogen concentration distribution in the depth direction from the surface of IGZO to the inside of the $SiO_x$ film has a peak with high hydrogen concentration in the interface regions of the oxide-semiconductor layer 141 and the insulating interlayer 116, the hydrogen concentration at the peak is 10 times higher or more than the typical hydrogen concentration in the inner film regions of the insulating interlayer and the oxide-semiconductor layer.

It is also found that, when the peak hydrogen concentration in the interface regions of the insulating interlayer 116 and the oxide-semiconductor layer 141 or in the interface regions of the first-gate-insulating layer 112 and the insulating interlayer 116 is lower than $1\times10^{22}$ cm$^{-3}$, the oxide semiconductor TFT may be used as a switching element.

Embodiment 8

Figure 23:
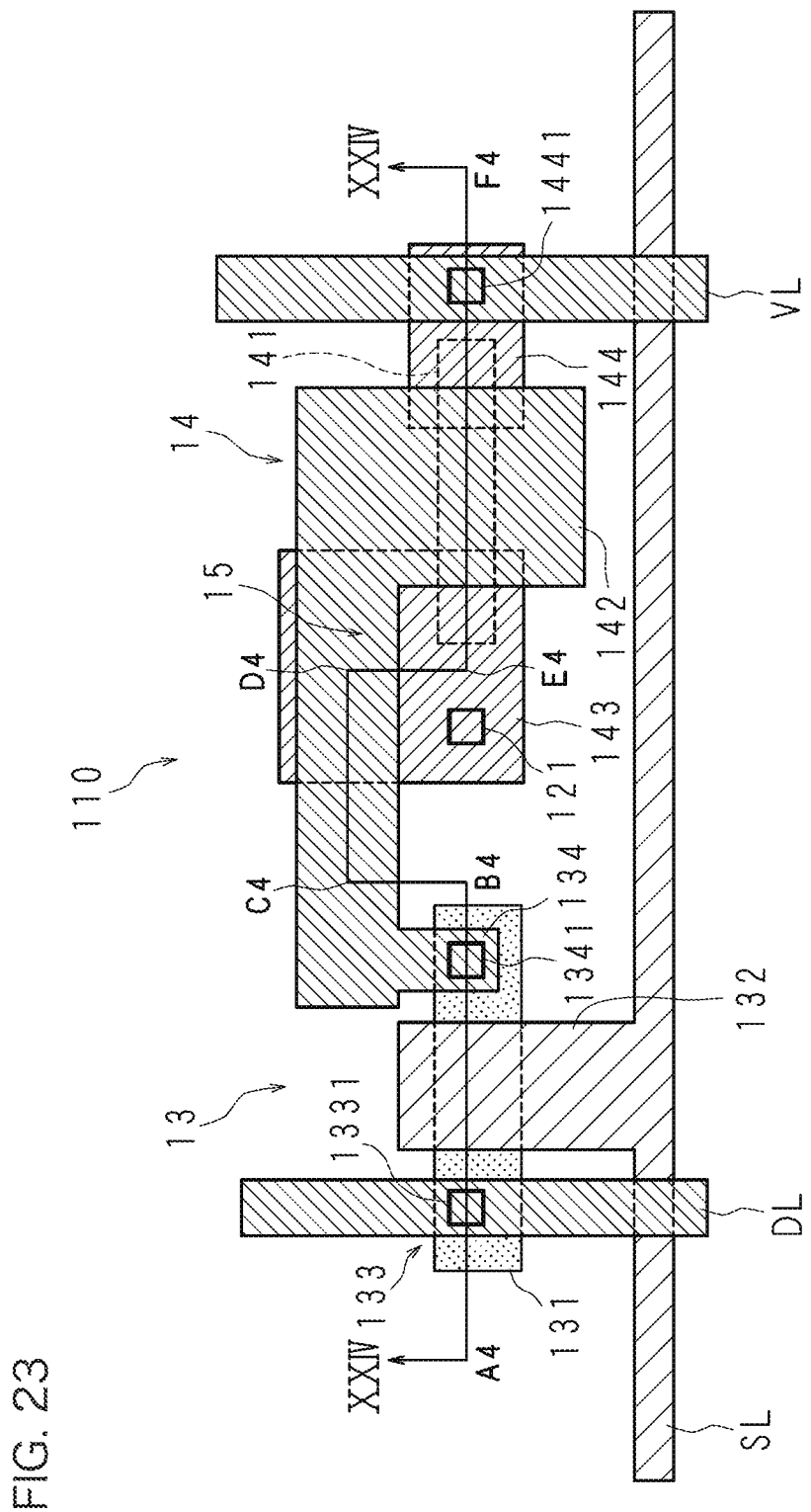
FIG. 23 is a plan view illustrating a configuration example of a semiconductor device included in a pixel drive circuit according to Embodiment 8.
Figure 24:
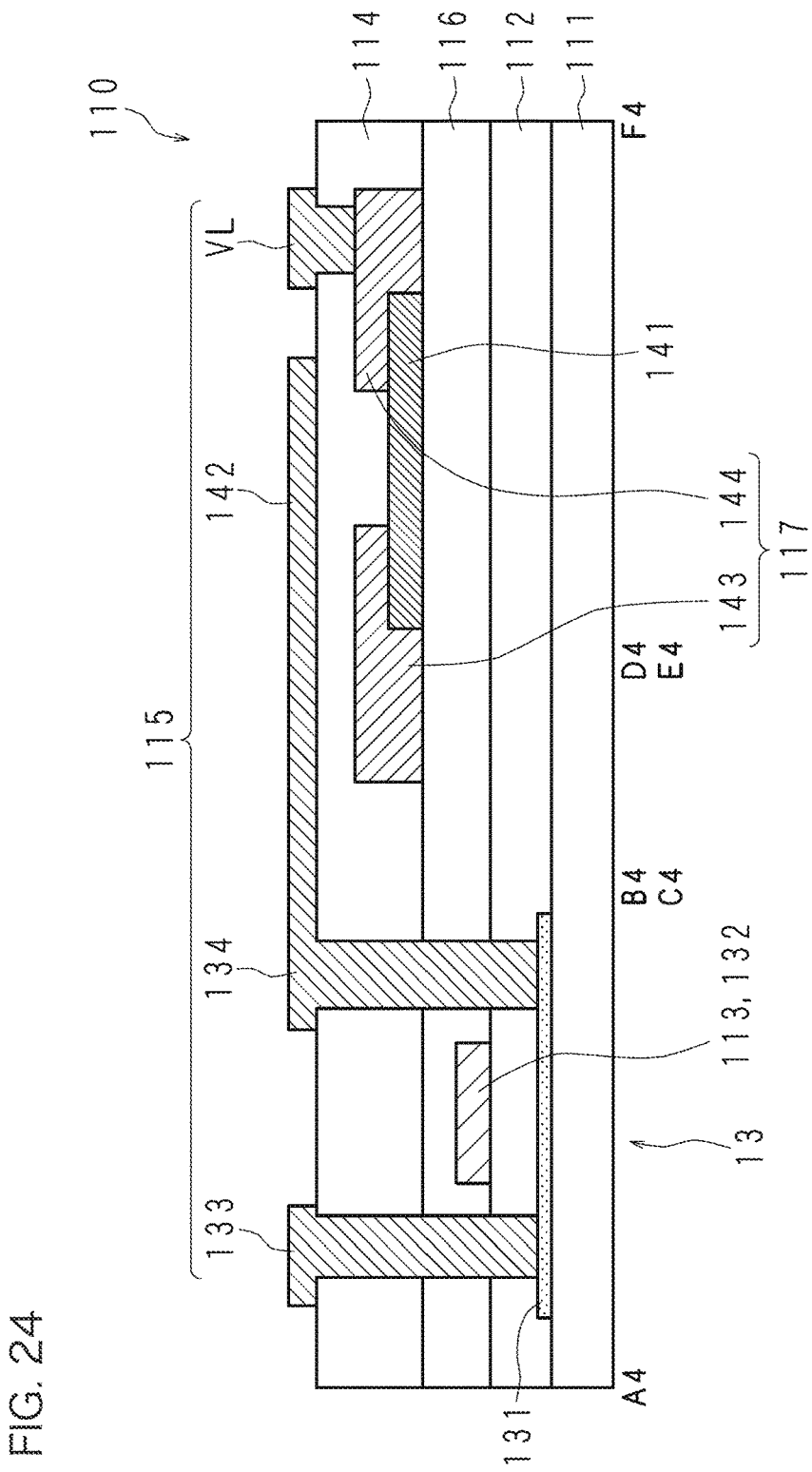
FIG. 24 is a cross-sectional view taken along the section line XXIV-XXIV in FIG. 23.

FIG. 23 is a plan view illustrating a configuration example of a semiconductor device 110 included in a pixel drive circuit. FIG. 24 is a cross-sectional view taken along the section line XXIV-XXIV in FIG. 23. The semiconductor device 110 includes an insulating substrate 111, a polysilicon layer 131, a first-gate-insulating layer 112, a first metal layer 113, an insulating interlayer 116, an oxide-semiconductor layer 141, a third metal layer 117, a second-gate-insulating layer 114 and a second metal layer 115.

In the semiconductor device 110, layers are formed in the above-described order on the insulating substrate 111 which is the lowest layer. That is, the polysilicon layer 131 is formed on the insulating substrate 111. The insulating interlayer 116 is formed on the polysilicon layer 131. The oxide-semiconductor layer 141 is formed on the insulating interlayer 116. The third metal layer 117 is formed on the oxide-semiconductor layer 141. The second-gate-insulating layer 114 is formed on the third metal layer 117. The second metal layer 115 is formed on the second-gate-insulating layer 114. The materials used for the layers are similar to those in Embodiment 1, and thus will not be described here.

In the semiconductor device 110, the first transistor 13 and the second transistor 14 are formed. The first transistor 13 uses the polysilicon layer 131 as a channel. The gate 132 is made of the first metal layer 113. That is, a portion of the first metal layer 113 that is opposed to the channel 131 serves as the gate 132 of the first transistor 13. The source 133 and drain 134 of the first transistor 13 is made of the second metal layer 115. That is, the source 133 is a portion of the second metal layer 115. The source 133 is electrically connected to the channel 131 through a contact hole 1331. Likewise, the drain 134 is a portion of the second metal layer 115. The drain 134 is electrically connected to the channel 131 through a contact hole 1341. The first transistor 13 is a top-gate planar thin film transistor.

The second transistor 14 uses the oxide-semiconductor layer 141 as a channel. The gate 142 is made of the second metal layer 115. That is, a portion of the second metal layer 115 that is opposed to the channel 141 serves as the gate 142. The source 143 and drain 144 of the second transistor 14 is made of the third metal layer 117. The second transistor 14 is a top-gate planar thin film transistor.

The drain 134 of the first transistor 13 and the gate 142 of the second transistor 14 are made of the same second metal layer 115. The drain 134 and the gate 142 are physically integrated with each other. Electrical conduction is made between the drain 134 and the gate 142.

A portion of the third metal layer 117 serving as the source 143 of the second transistor 14 expands in the wiring direction of the signal line DL. A portion of the second metal layer 115 that connects the drain 134 of the first transistor 13 and the gate 142 of the second transistor 14 is opposed to a portion of the third metal layer 117 across the second-gate-insulating layer 114 which is interposed between them. With the second-gate-insulating layer 114 in between, the opposed portions of the third metal layer 117 and the second metal layer 115 serve as the storage capacitor 15. Moreover, at a part of the source 143 of the second transistor 14, a contact hole 121 is formed. The contact hole 121 is for electrically connecting the anode of the organic EL element 12 and the source 143.

The signal line DL is made of the second metal layer 115. The signal line DL and the source 133 of the first transistor 13 are physically integrated with each other. Electrical conduction is made between the signal line DL and the source 133.

The power line VL is made of the second metal layer 115. The power line VL and the drain 144 of the second transistor 14 are connected to each other through the contact hole 1441.

Figure 25:
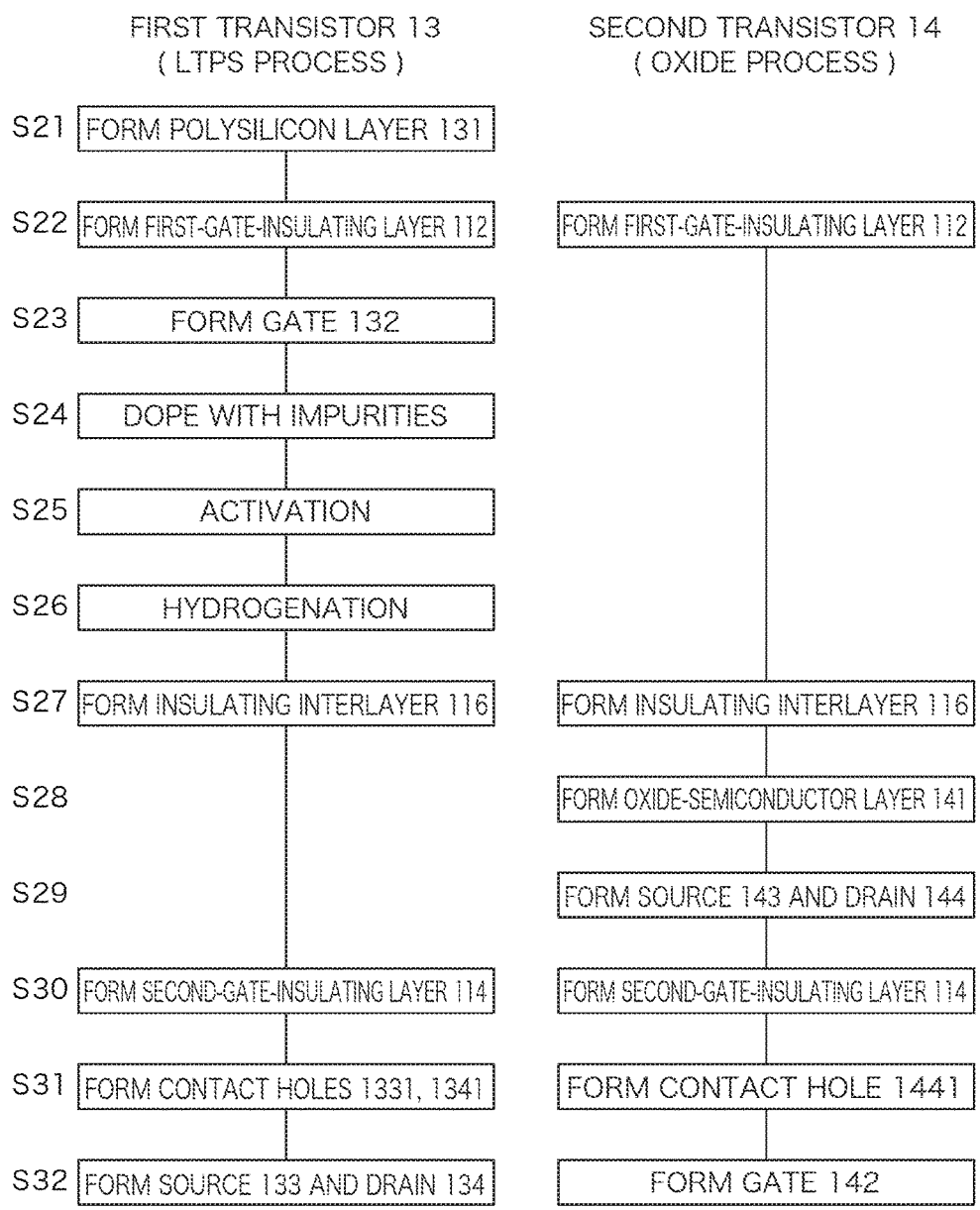
FIG. 25 is a flowchart illustrating a manufacturing procedure for a semiconductor device according to Embodiment 8.

A manufacturing procedure for the semiconductor device 110 will now be described. FIG. 25 is a flowchart illustrating a manufacturing procedure for the semiconductor device 110. FIGS. 26A to 26D, 27A to 27B and 28A to 28B are cross-sectional views illustrating the manufacturing procedure for the semiconductor device 110. The cross-sections in FIGS. 26A to 26D, 27A to 27B and 28A to 28B are similar to the cross-section in FIG. 24. An LTPS process for forming the first transistor 13 and an oxide semiconductor process for forming the second transistor 14 are carried out concurrently and in parallel. The steps illustrated side by side in FIG. 25 imply that they are performed at the same time. FIGS. 26A to 26D, 27A to 27B and 28A to 28B illustrate the states after the steps in FIG. 25 are carried out. The configuration obtained after performing a part of the procedure illustrated in FIG. 25 will not be illustrated in FIGS. 26A to 26D, 27A to 27B, 28A to 28B and 29. The details of the steps illustrated in FIG. 25 are similar to those in Embodiment 1, and thus will not be specifically described.

First, the insulating substrate 111 is prepared. The polysilicon layer 131 is formed on the insulating substrate 111 (step S21). By performing step S21, the polysilicon layer 131 of an island shape having a predetermined surface area is completed. The state illustrated in FIG. 26A is thus obtained.

The first-gate-insulating layer 112 is formed on the insulating substrate 111 and the polysilicon layer 131 (step S22). The state illustrated in FIG. 26B is thus obtained.

The gate 132 of the first transistor 13 is formed on the first-gate-insulating layer 112 (step S23). The state illustrated in FIG. 26C is thus obtained.

Impurities are doped into the polysilicon layer 131 (step S24). The polysilicon layer 131 is activated (step S25). The polysilicon layer 131 is hydrogenated (step S26). The insulating interlayer 116 is formed (step S27). The state illustrated in FIG. 26D is thus obtained.

The oxide-semiconductor layer 141 is formed (step S28). The state illustrated in FIG. 27A is thus obtained. The source 143 and drain 144 of the second transistor 14 are formed (step S29). The state illustrated in FIG. 27B is thus obtained. The channel 141 is formed on the insulating interlayer 116. The source 143 and the drain 144 are formed on the insulating interlayer 116 so as to cover a part of the channel 141.

Figure 28A:
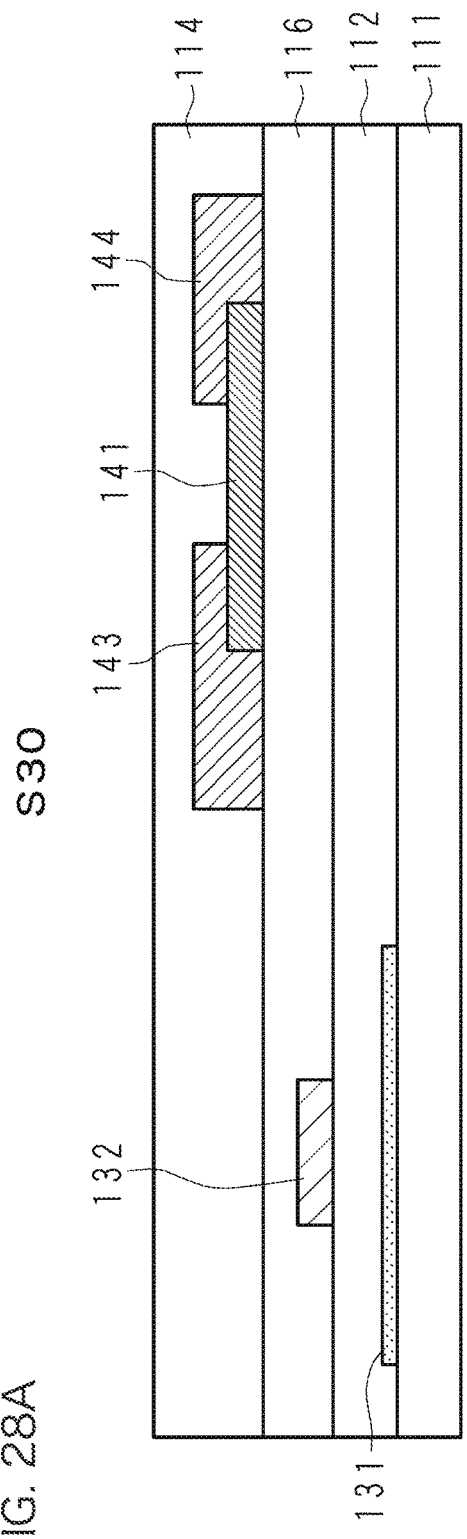
FIGS. 28A and 28B are cross-sectional views illustrating a manufacturing procedure for the semiconductor device according to Embodiment 8.
Figure 28B:
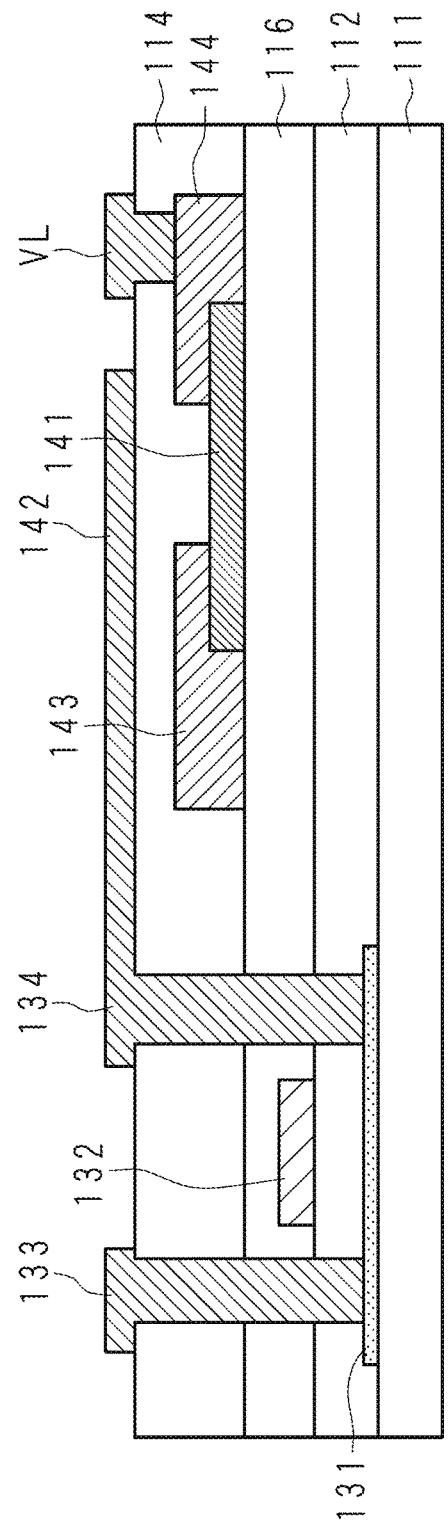

The second-gate-insulating layer 114 is formed (step S30). The state illustrated in FIG. 28A is thus obtained. The contact holes 1331 and 1341 to the polysilicon layer 131 and the contact hole 1441 to the drain 144 are formed (step S31). The source 133 and drain 134 of the first transistor 13 as well as the gate 142 of the second transistor 14 are formed (step S32). The state illustrated in FIG. 28B is thus obtained.

As described above, since the scanning line SL is a part of the first metal layer 113, it is formed at step S23. Moreover, since the signal line DL and the power line VL are a part of the second metal layer 115, they are formed at step S32.

It has become clear that a structure similar to that in Embodiment 6 may also be attained in Embodiment 8. That is, it has been found that, by the hydrogenation step at step S6, a region with locally high hydrogen concentration is formed in the vicinity of the interfaces of the first-gate-insulating layer 112 made of $SiO_x$ and the insulating interlayer 116 made of $SiO_x$. The peak value of hydrogen concentration in this local region is $1\times10^{21}$ cm$^{-3}$ or higher. This is a value 10 times higher or more than the value of the typical hydrogen concentration ($1\times10^{20}$ cm$^{-3}$ to $2\times10^{20}$ cm$^{-3}$) in the gate insulating layer 112 or the insulating interlayer 116.

According to the present embodiment, the following effects are produced. After the hydrogenation step (step S26) included in the step of forming the first transistor 13, the oxide-semiconductor layer 141 is formed, which will serve as a channel for the second transistor 14 (step S28). As in Embodiment 1, the possibility of the oxide-semiconductor layer 141 being exposed to hydrogen plasma is reduced, which can suppress the second transistor 14 having the normally-on characteristic.

The second transistor 14 is of a top-gate planar type. The need for a contact hole for connecting the source 133 or drain 134 of the first transistor 13 and the gate 142 of the second transistor 14 is eliminated. This makes it possible to reduce the plane area necessary for forming the semiconductor device 110. As a result, the number of thin film transistors that can be integrated in a pixel may be increased. A more compact pixel circuit with the same logical configuration may be attained, which can enhance the precision. Furthermore, the aperture ratio in a transparent panel may be improved.

Embodiment 9

Figure 29:
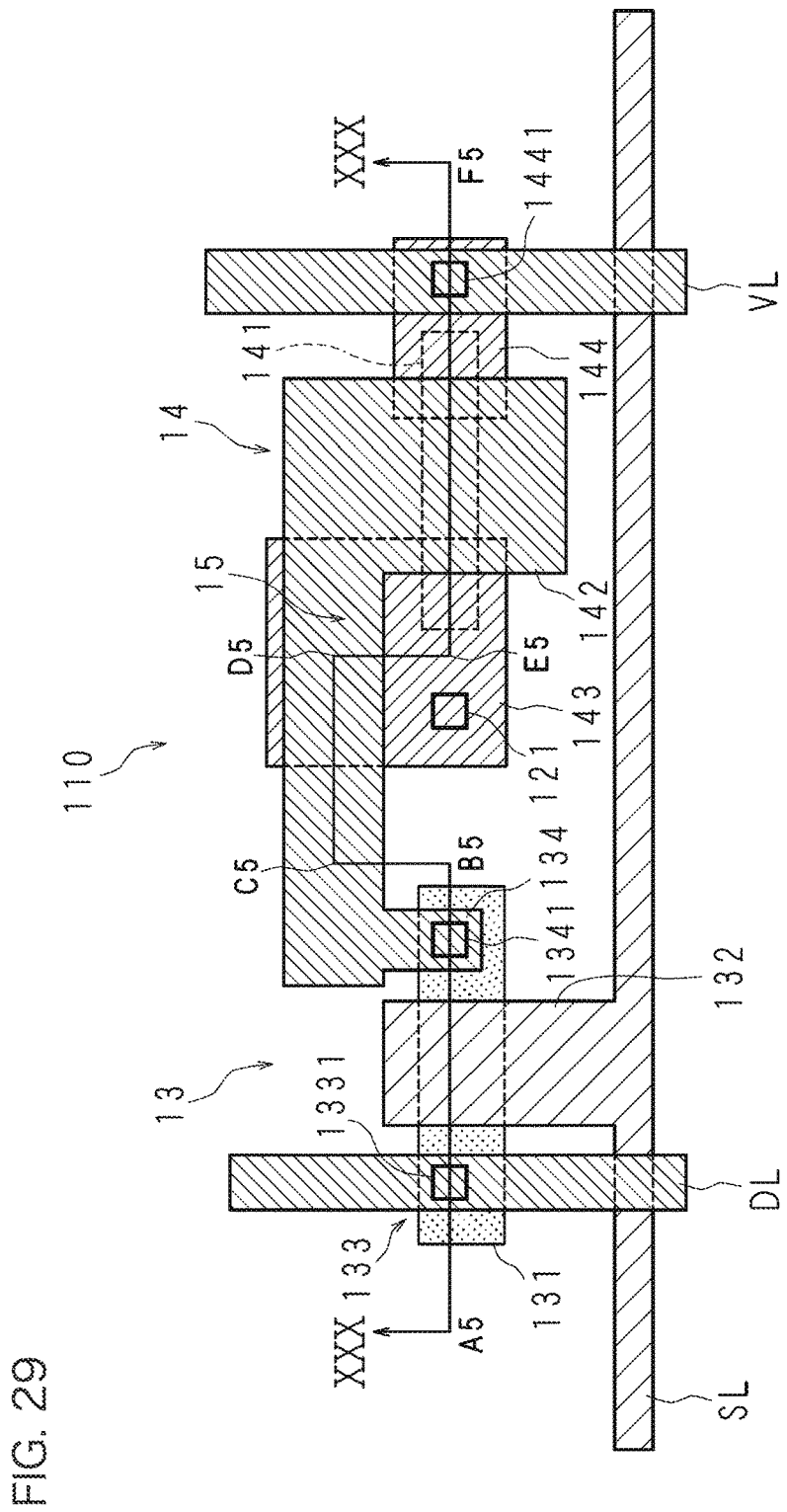
FIG. 29 is a plan view illustrating a configuration example of a semiconductor device included in a pixel drive circuit according to Embodiment 9.
Figure 30:
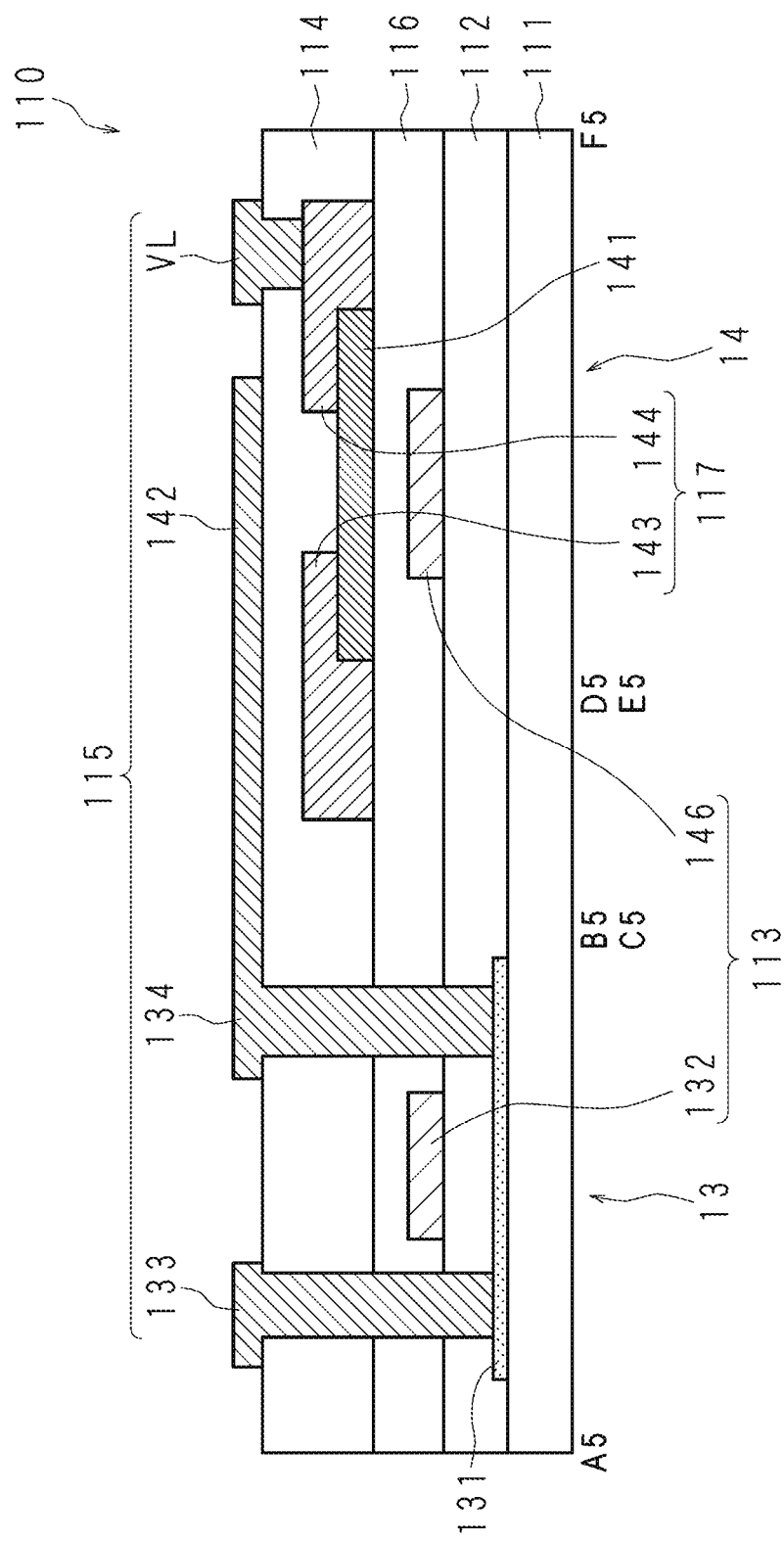
FIG. 30 is a cross-sectional view taken along the section line XXX-XXX.

FIG. 29 is a plan view illustrating a configuration example of a semiconductor device 110 included in a pixel drive circuit. FIG. 30 is a cross-sectional view taken along the section line XXX-XXX in FIG. 29. In FIGS. 29 and 30, configuration parts similar to those in Embodiment 5 described above are denoted by the same reference codes and will not be described here. The present embodiment is different from Embodiment 5 in that the second transistor 14 comprises a bottom gate 146. The bottom gate 146 is formed on the first-gate-insulating layer 112. The bottom gate 146 is so provided as to be opposed to the channel 141 across the insulating interlayer 116. The bottom gate 146 is a part of the first metal layer 113. The bottom gate 146 is formed concurrently with the top gate 132 of the first transistor 13. The manufacturing procedure for the semiconductor device 110 according to the present embodiment is similar to the procedure illustrated in FIG. 25. One difference is that the bottom gate 146 is formed at step S23 illustrated in FIG. 25.

The second transistor 14 is a top gate thin film transistor, while the bottom gate 146 allows it to more stably operate compared to the case without the bottom gate 146.

Embodiment 10

Figure 31:
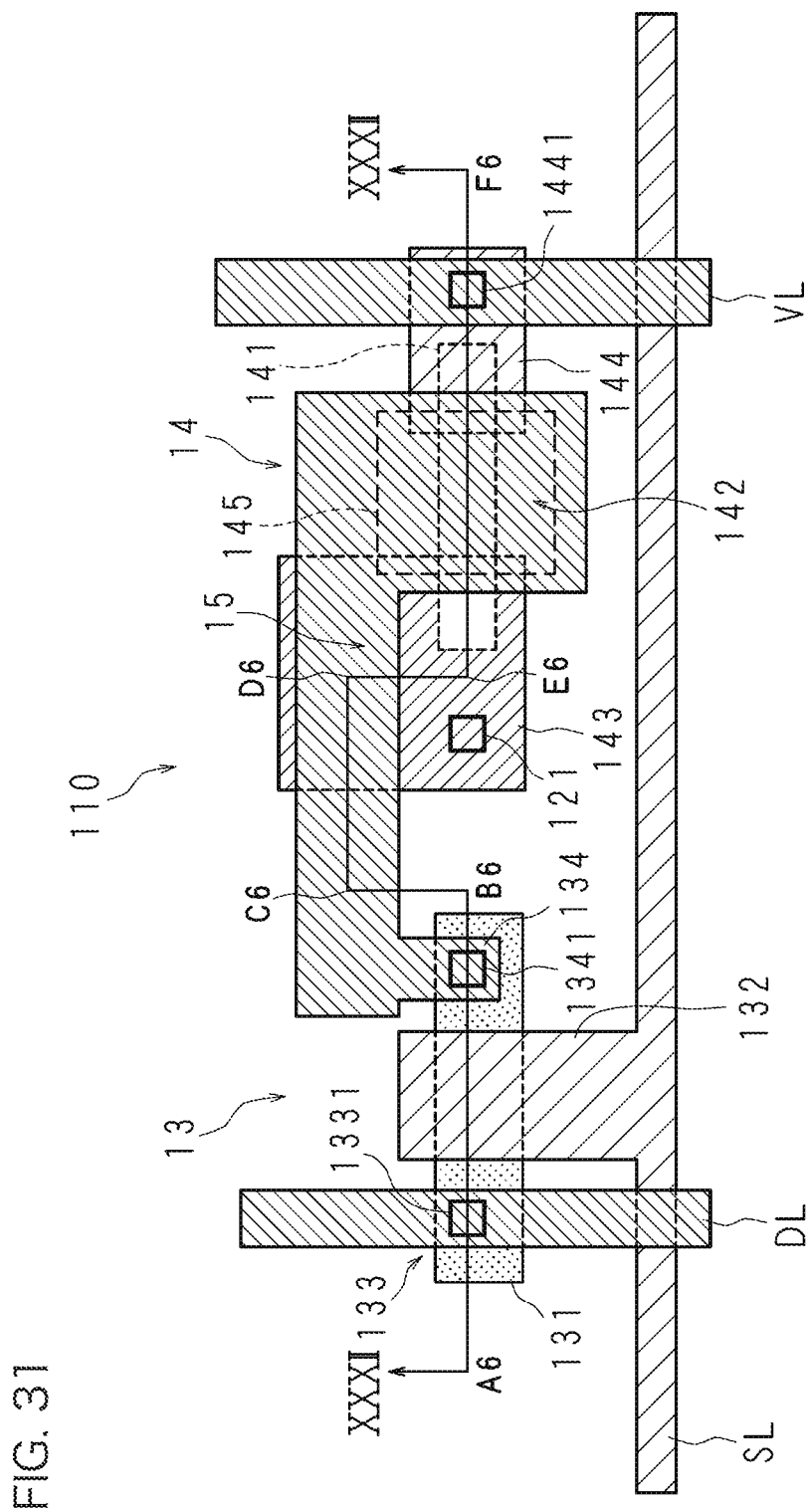
FIG. 31 is a plan view illustrating a configuration example of a semiconductor device included in a pixel drive circuit according to Embodiment 10.
Figure 32:
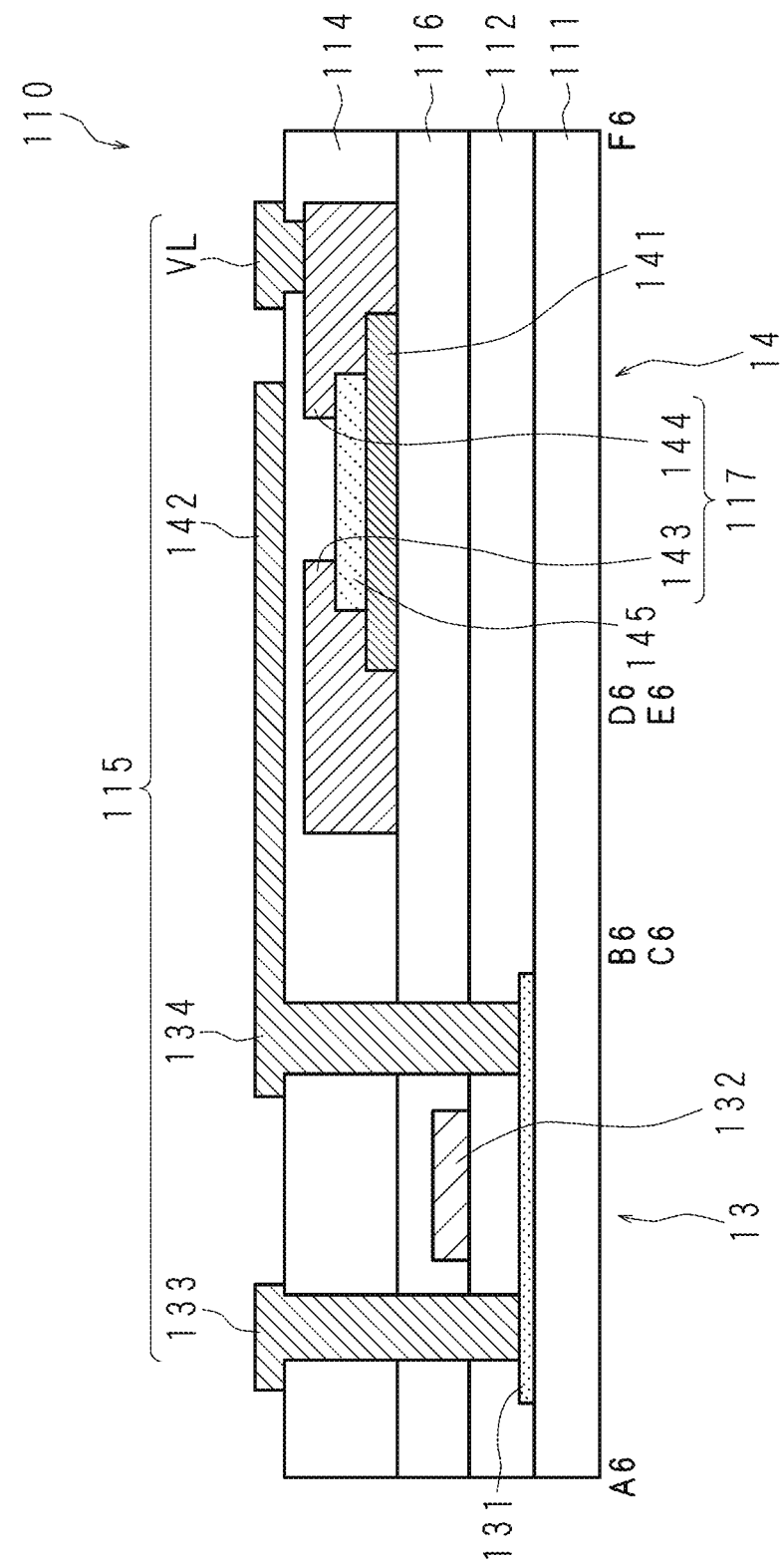
FIG. 32 is a cross-sectional view taken along the section line XXXII-XXXII.

FIG. 31 is a plan view illustrating a configuration example of a semiconductor device 110 included in a pixel drive circuit. FIG. 32 is a cross-sectional view taken along the section line XXXII-XXXII in FIG. 31. In FIGS. 31 and 32, configuration parts similar to those in Embodiment 8 described above are denoted by the same reference codes and will not be described here. The present embodiment is different from Embodiment 8 in that the second transistor 14 comprises an insulating film 145. The insulating film 145 is formed of $SiO_x$ (silicon oxide). The insulating film 145 is formed at a portion on the oxide-semiconductor layer 141. On the upper surface of the oxide-semiconductor layer 141 where no insulating film 145 is formed, a part of the source 143 and a part of the drain 144 is formed. On a portion of the insulating film 145, the source 143 and the drain 144 are formed. On the other portion of the insulating film 145, the second-gate-insulating layer 114 is formed. The manufacturing procedure for the semiconductor device 110 according to the present embodiment is similar to the procedure illustrated in FIG. 25. One difference is that a step of generating the insulating film 145 is added between the step of forming the oxide-semiconductor layer 141 (step S28) and the step of forming the source 143 and drain 144 (step S29) illustrated in FIG. 25.

According to the present embodiment, the insulating film 145 is provided. As a result, it is possible to suppress deterioration of the oxide-semiconductor layer 141 by the steps after the step of forming the oxide-semiconductor layer 141 at the time of manufacturing the semiconductor device 110.

Embodiment 11

Figure 33:
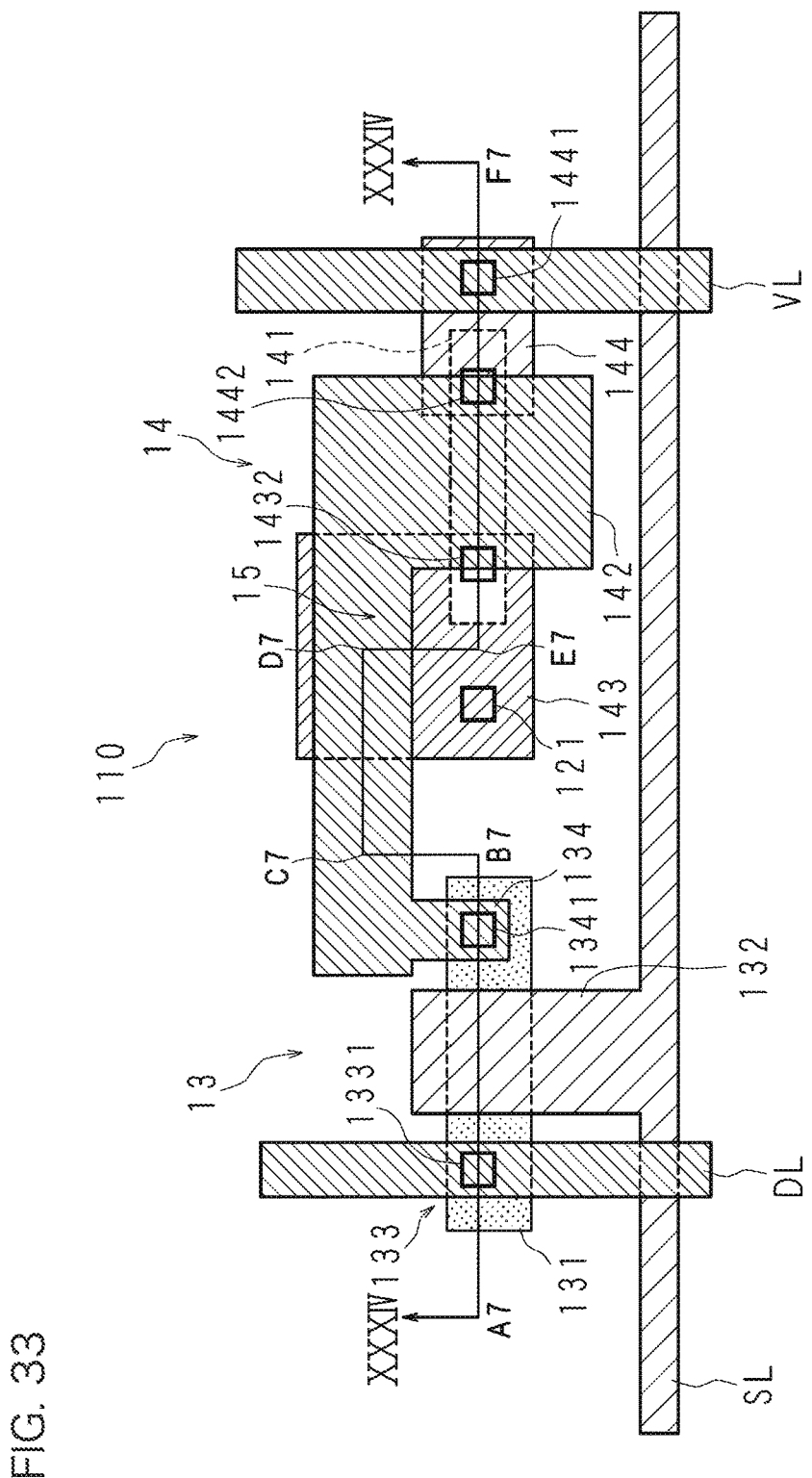
FIG. 33 is a plan view illustrating a configuration example of a semiconductor device included in a pixel drive circuit according to Embodiment 11.
Figure 34:
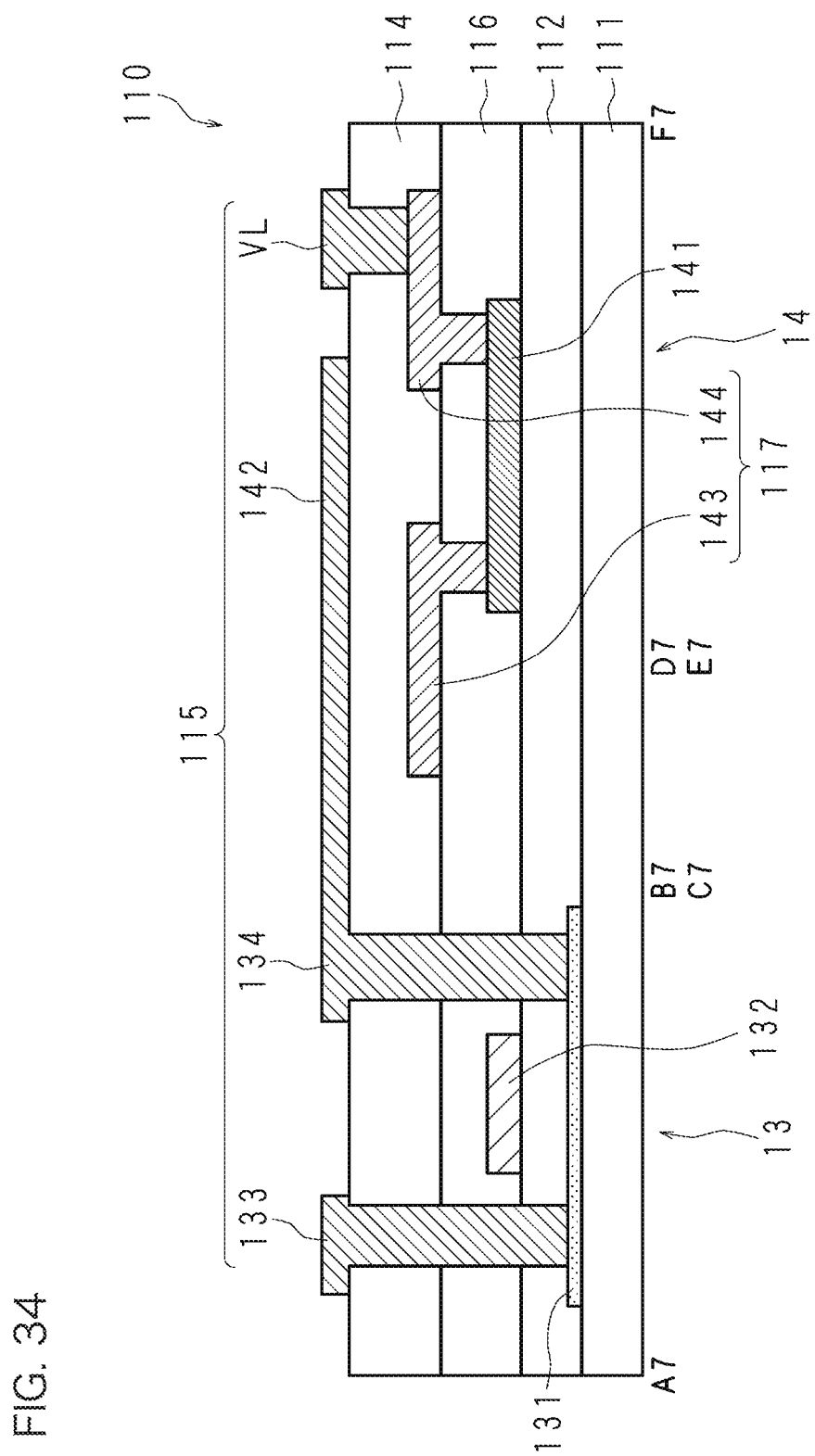
FIG. 34 is a cross-sectional view taken along the section line XXXIV-XXXIV.

FIG. 33 is a plan view illustrating a configuration example of a semiconductor device 110 included in a pixel drive circuit. FIG. 34 is a cross-sectional view taken along the section line XXXIV-XXXIV in FIG. 33. In FIGS. 33 and 34, configuration parts similar to those in Embodiment 8 described above are denoted by the same reference codes and will not be described here. The present embodiment is different from Embodiment 8 in that the oxide-semiconductor layer 141 is formed on the first-gate-insulating layer 112.

Figure 35:
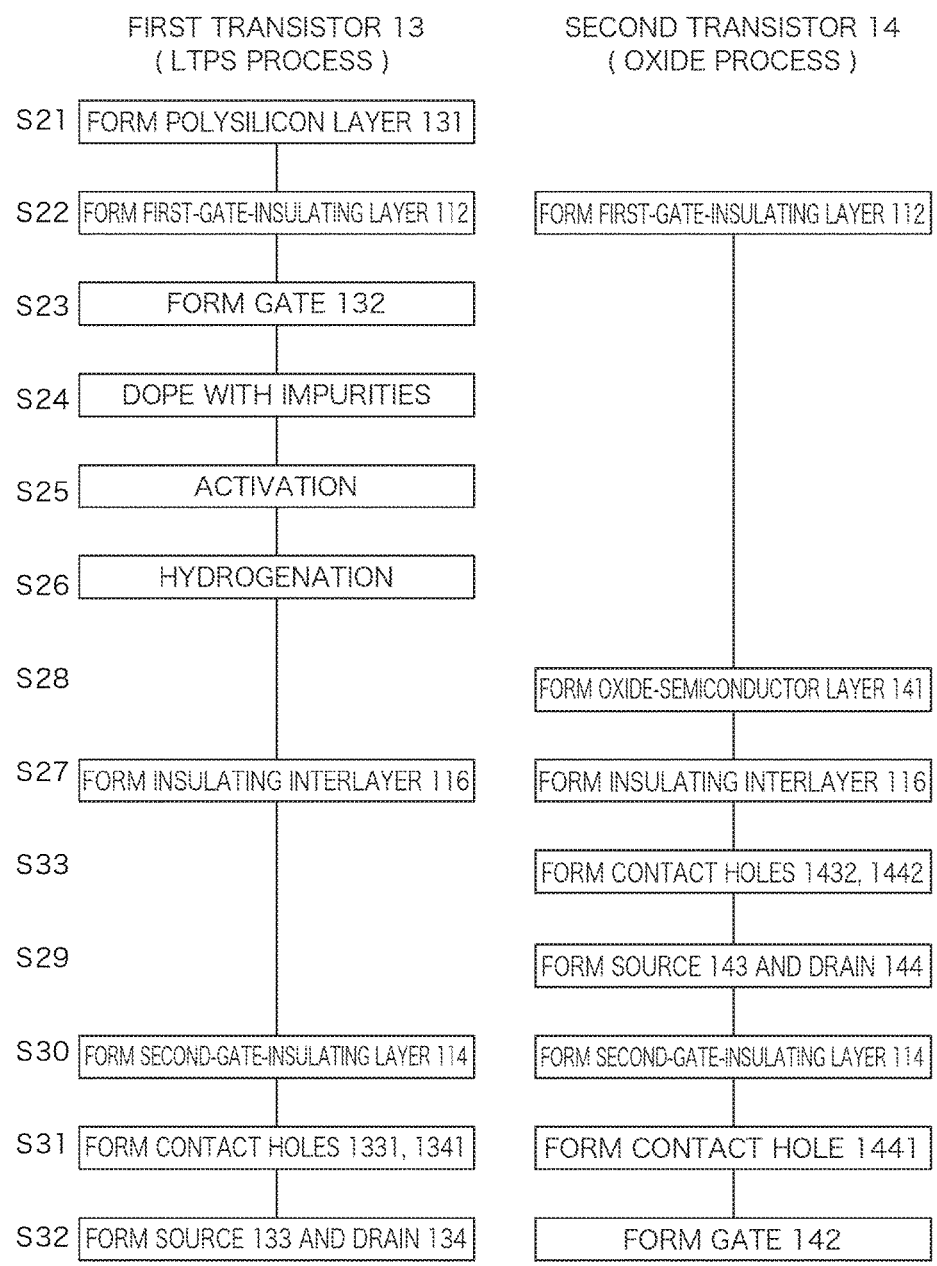
FIG. 35 is a flowchart illustrating a manufacturing procedure for a semiconductor device according to Embodiment 11.

FIG. 35 is a flowchart illustrating a manufacturing procedure for the semiconductor device 110. FIGS. 36A to 36D, 37A to 37B and 38A to 38B are cross-sectional views illustrating the manufacturing procedure for the semiconductor device 110. The cross-sections in FIGS. 36A to 36D, 37A to 37B and 38A to 38B are similar to the cross-section in FIG. 34.

First, the insulating substrate 111 is prepared, and the polysilicon layer 131 is formed on the insulating substrate 111 (step S21). The state illustrated in FIG. 36A is thus obtained.

The first-gate-insulating layer 112 is formed on the insulating substrate 111 and the polysilicon layer 131 (step S22). The state illustrated in FIG. 36B is thus obtained. The gate 132 of the first transistor 13 is formed on the first-gate-insulating layer 112 (step S23). The state illustrated in FIG. 36C is thus obtained. Impurities are doped into the polysilicon layer 131 (step S24). Next, the polysilicon layer 131 is activated (step S25). Next, the polysilicon layer 131 is hydrogenated (step S26).

Next, the oxide-semiconductor layer 141 is formed (step S28). The state illustrated in FIG. 36D is thus obtained. Next, the insulating interlayer 116 is formed (step S27). The state illustrated in FIG. 37A is thus obtained. The contact holes 1432 and 1442 are formed (step S33). The source 143 and the drain 144 are formed (step S29). The state illustrated in FIG. 37B is thus obtained.

Furthermore, the second-gate-insulating layer 114 is formed (step S30). The state illustrated in FIG. 38A is thus obtained. Next, the contact holes 1331, 1341 and 1441 are formed (step S31). The source 133 and drain 134 of the first transistor 13 as well as the gate 142 of the second transistor 14 are then formed (step S32). The state illustrated in FIG. 38B is thus obtained.

According to the present embodiment, the following effects are produced. After the hydrogenation step (step S26) included in the step of forming the first transistor 13, the oxide-semiconductor layer 141 which will serve as a channel for the second transistor 14 is formed (step S28). This can reduce the possibility of the oxide-semiconductor layer 141 being exposed to hydrogen plasma. It is therefore possible to suppress the second transistor 14 having the normally-on characteristic.

According to the present embodiment, the insulating interlayer 116 is formed on the oxide-semiconductor layer 141. The source 143 and the drain 144 are formed on the insulating interlayer 116. Accordingly, the oxide-semiconductor layer 141 is covered with the insulating interlayer 116 at the time of forming the source 143 and the drain 144. It is therefore possible to suppress degradation in the characteristic of the oxide-semiconductor layer 141 in the step of forming the source 143 and the drain 144.

In Embodiments 8 to 11, metal layers are represented to match the representation in Embodiments 1 to 5. If the metal layers were represented in the order of being formed on the insulating substrate 111, however, the second metal layer 115 would be represented as the third metal layer whereas the third metal layer 117 would be represented as the second metal layer in Embodiments 8 to 11.

The technical features (components) described in each embodiment may be combined with one another, and such combinations may form new technical features. It should be understood that the embodiments disclosed herein are illustrative and non-restrictive in every respect. Since the scope of the present invention is defined by the appended claims rather than by the description preceding them, all changes that fall within metes and bounds of the claims, or equivalence of such metes and bounds thereof are therefore intended to be embraced by the claims.

It is noted that, as used herein and in the appended claims, the singular forms "a", "an", and "the" include plural referents unless the context clearly dictates otherwise.

What is claimed is:

1. A semiconductor device comprising:
an insulating substrate;
a polysilicon layer formed on the insulating substrate;
a first-gate-insulating layer formed on the polysilicon layer;
a first metal layer formed on the first-gate-insulating layer;
an oxide-semiconductor layer formed on the first-gate-insulating layer;
a second-gate-insulating layer formed on the oxide-semiconductor layer;
a second metal layer formed on the second-gate-insulating layer;
a first top gate planar thin film transistor in which the polysilicon layer serves as a channel and which includes a source, a drain and a gate; and
a second top gate thin film transistor in which the oxide-semiconductor layer serves as a channel and which includes a source, a drain and a gate, wherein
the source and the drain of the first top gate planar thin film transistor and the gate of the second top gate thin film transistor are made of the second metal layer, and
the source or the drain of the first top gate planar thin film transistor and the gate of the second top gate thin film transistor are electrically connected to each other.

2. The semiconductor device according to claim 1, wherein
a high-hydrogen-concentration region in which hydrogen concentration becomes local maximum is formed at an interface region of the first-gate-insulating layer and the oxide-semiconductor layer.

3. The semiconductor device according to claim 2, wherein
hydrogen concentration in the high-hydrogen-concentration region is 10 times higher or more and 100 times lower than hydrogen concentration in an inner region of the first-gate-insulating layer or an inner region of the oxide-semiconductor layer.

4. The semiconductor device according to claim 2, wherein
hydrogen concentration in the high-hydrogen-concentration region is equal to or higher than $1 \times 10^{21}$ cm$^{-3}$ and lower than $1 \times 10^{22}$ cm$^{-3}$.

5. The semiconductor device according to claim 1, wherein
the source and the drain of the second top gate thin film transistor are formed of the first metal layer.

6. The semiconductor device according to claim 1, further comprising an insulating interlayer formed between the first-gate-insulating layer and the second-gate-insulating layer,
wherein the source and the drain of the second top gate thin film transistor is electrically connected to the channel of the second top gate thin film transistor through a contact hole formed in the insulating interlayer.

7. A display apparatus comprising:
the semiconductor device according to claim 1; and
a light emitting element, wherein
the second top gate thin film transistor supplies drive current to the light emitting element, and
the first top gate planar thin film transistor controls gate voltage of the second top gate thin film transistor.

8. The display apparatus according to claim 7, comprising:
a data line for applying voltage to the source or drain of the first top gate planar thin film transistor; and
a power line for applying power voltage to the second top gate thin film transistor, wherein
the data line and the power line are formed of the second metal layer.

9. The display apparatus according to claim 8, comprising a scan line for applying voltage to a gate of the first top gate planar thin film transistor, wherein
the scan line is formed of the first metal layer.

10. A semiconductor device comprising:
an insulating substrate;
a polysilicon layer formed on the insulating substrate;
a first-gate-insulating layer formed on the polysilicon layer;
a first metal layer formed on the first-gate-insulating layer;
an insulating interlayer formed on the first-gate-insulating layer;
an oxide-semiconductor layer formed on the insulating interlayer;
a second metal layer formed on the oxide-semiconductor layer;
a second-gate-insulating layer formed on the second metal layer;
a third metal layer formed on the second-gate-insulating layer;
a first top gate planar thin film transistor in which the polysilicon layer serves as a channel and which has a source, a drain and a gate; and
a second top gate thin film transistor in which the oxide-semiconductor layer serves as a channel and which has a source, a drain and a gate, wherein
the source and the drain of the first top gate planar thin film transistor and the gate of the second top gate thin film transistor are made of the third metal layer, and
the source or the drain of the first top gate planar thin film transistor and the gate of the second top gate thin film transistor are electrically connected to each other.

11. The semiconductor device according to claim 10, wherein
a high-hydrogen-concentration region in which hydrogen concentration becomes local maximum is formed at an interface region of the first-gate-insulating layer and the insulating interlayer.

12. The semiconductor device according to claim 11, wherein
hydrogen concentration in the high-hydrogen-concentration region is 10 times higher or more and 100 times lower than hydrogen concentration in an inner region of the first-gate-insulating layer or an inner region of the insulating interlayer.

13. The semiconductor device according to claim 11, wherein
hydrogen concentration in the high-hydrogen-concentration region is equal to or higher than $1\times10^{21}$ cm$^{-3}$ and lower than $1\times10^{22}$ cm$^{-3}$.

14. The semiconductor device according to claim 10, wherein
a high-hydrogen-concentration region in which hydrogen concentration becomes local maximum is formed at an interface region of the insulating interlayer and the oxide-semiconductor layer.

15. The semiconductor device according to claim 14, wherein
hydrogen concentration in the high-hydrogen-concentration region is 10 times higher or more and 100 times lower than hydrogen concentration in an inner region of the insulating interlayer or an inner region of the oxide-semiconductor layer.

16. The semiconductor device according to claim 14, wherein
hydrogen concentration in the high-hydrogen-concentration region is equal to or higher than $1\times10^{21}$ cm$^{-3}$ and lower than $1\times10^{22}$ cm$^{-3}$.

17. A semiconductor device comprising:
an insulating substrate;
a polysilicon layer formed on the insulating substrate;
a first-gate-insulating layer formed on the polysilicon layer;
a first metal layer formed on the first-gate-insulating layer;
an insulating interlayer formed on the first-gate-insulating layer;
a second metal layer formed on the insulating interlayer;
an oxide-semiconductor layer formed on the second metal layer;
a second-gate-insulating layer formed on the oxide-semiconductor layer;
a third metal layer formed on the second-gate-insulating layer;
a first top gate planar thin film transistor in which the polysilicon layer serves as a channel and which has a source, a drain and a gate; and
a second top gate thin film transistor in which the oxide-semiconductor layer serves as a channel and which has a source, a drain and a gate, wherein
the source and the drain of the first top gate planar thin film transistor and the gate of the second top gate thin film transistor are made of the third metal layer, and
the source or the drain of the first top gate planar thin film transistor and the gate of the second top gate thin film transistor are electrically connected to each other.

18. The semiconductor device according to claim 17, wherein
a high-hydrogen-concentration region in which hydrogen concentration becomes local maximum is formed at an interface region of the first-gate-insulating layer and the insulating interlayer.

19. The semiconductor device according to claim 18, wherein
hydrogen concentration in the high-hydrogen-concentration region is 10 times higher or more and 100 times lower than hydrogen concentration in an inner region of the first-gate-insulating layer or an inner region of the insulating interlayer.

20. The semiconductor device according to claim 18, wherein
hydrogen concentration in the high-hydrogen-concentration region is equal to or higher than $1\times10^{21}$ cm$^{-3}$ and lower than $1\times10^{22}$ cm$^{3}$.

21. The semiconductor device according to claim 17, wherein
a high-hydrogen-concentration region in which hydrogen concentration becomes local maximum is formed at an interface region of the insulating interlayer and the oxide-semiconductor layer.

22. The semiconductor device according to claim 21, wherein
hydrogen concentration in the high-hydrogen-concentration region is 10 times higher or more and 100 times lower than hydrogen concentration in an inner region of the insulating interlayer or an inner region of the oxide-semiconductor layer.

23. The semiconductor device according to claim 21, wherein
hydrogen concentration in the high-hydrogen-concentration region is equal to or higher than $1\times10^{21}$ cm$^{-3}$ and lower than $1\times10^{22}$ cm$^{3}$.

* * * * *